United States Patent
Kumazawa et al.

(10) Patent No.: US 11,680,139 B2
(45) Date of Patent: Jun. 20, 2023

(54) RESIN COMPOSITION, RESIN SHEET, MULTILAYER PRINTED WIRING BOARD, AND SEMICONDUCTOR DEVICE

(71) Applicant: MITSUBISHI GAS CHEMICAL COMPANY, INC., Tokyo (JP)

(72) Inventors: Yune Kumazawa, Tokyo (JP); Takuya Suzuki, Tokyo (JP); Seiji Shika, Tokyo (JP); Shunsuke Katagiri, Tokyo (JP)

(73) Assignee: MITSUBISHI GAS CHEMICAL COMPANY, INC., Tokyo (JP)

( * ) Notice: Subject to any disclaimer, the term of this patent is extended or adjusted under 35 U.S.C. 154(b) by 0 days.

(21) Appl. No.: 17/621,906

(22) PCT Filed: Jun. 26, 2020

(86) PCT No.: PCT/JP2020/025141
§ 371 (c)(1),
(2) Date: Dec. 22, 2021

(87) PCT Pub. No.: WO2020/262579
PCT Pub. Date: Dec. 30, 2020

(65) Prior Publication Data
US 2022/0204694 A1 Jun. 30, 2022

(30) Foreign Application Priority Data
Jun. 28, 2019 (JP) .............. JP2019-122268

(51) Int. Cl.
*C08G 73/10* (2006.01)
*C08K 5/3415* (2006.01)
*H05K 1/02* (2006.01)
*H05K 1/03* (2006.01)

(52) U.S. Cl.
CPC ........ *C08G 73/1025* (2013.01); *C08K 5/3415* (2013.01); *H05K 1/0298* (2013.01); *H05K 1/0373* (2013.01)

(58) Field of Classification Search
CPC ....... C08L 79/08; C09D 179/08; C08G 73/10; H05K 1/0298
See application file for complete search history.

(56) References Cited

U.S. PATENT DOCUMENTS

2018/0355231 A1* 12/2018 Litke .............. C09J 179/08
2019/0281697 A1  9/2019 Abe et al.
2020/0166844 A1  5/2020 Okada et al.

FOREIGN PATENT DOCUMENTS

| CN | 108699411 | 10/2018 |
|---|---|---|
| JP | 2005-62450 A | 3/2005 |
| JP | 2006-22173 A | 1/2006 |
| JP | 2008-235833 * | 10/2008 |
| JP | 2010-204298 A | 9/2010 |
| JP | 2016-169337 A | 9/2016 |
| JP | 2019-511587 A | 4/2019 |
| JP | 2020-33472 A | 3/2020 |
| WO | WO 2018/056466 A1 | 3/2018 |
| WO | WO 2019/013194 A1 | 1/2019 |
| WO | 2018/212116 A1 | 3/2020 |
| WO | WO 2020/203834 A1 | 10/2020 |

OTHER PUBLICATIONS

USPTO strucure search, May 2022.*
Exhibit 2, Certified Experimental Results dated Nov. 11, 2021, along with English Translation thereof.
ISR for PCT/JP2020/025141, dated Sep. 1, 2020.
Notice of Reasons for Refusal in JP App. No. 2020-555264, dated Dec. 14, 2020 (w/ translation).

* cited by examiner

*Primary Examiner* — Gregory Listvoyb
(74) *Attorney, Agent, or Firm* — Greenblum & Bernstein, P.L.C.

(57) ABSTRACT

A resin composition of the present invention is a resin composition containing a bismaleimide compound (A) containing a constituent unit represented by the following formula (1), and maleimide groups at both ends of the molecular chain, at least one resin or compound (B) selected from the group consisting of a maleimide compound other than the bismaleimide compound (A), a cyanate compound, a benzoxazine compound, an epoxy resin, a carbodiimide compound, and a compound having an ethylenically unsaturated group, and a photo initiator (C):

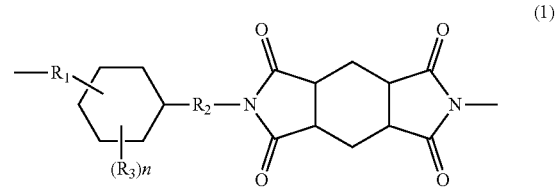

(1)

wherein $R_1$ represents a linear or branched alkylene group having 1 to 16 carbon atoms, or a linear or branched alkenylene group having 2 to 16 carbon atoms; $R_2$ represents a linear or branched alkylene group having 1 to 16 carbon atoms, or a linear or branched alkenylene group having 2 to 16 carbon atoms; each $R_3$ independently represents a hydrogen atom, a linear or branched alkyl group having 1 to 16 carbon atoms, or a linear or branched alkenyl group having 2 to 16 carbon atoms; and each n independently represents an integer of 1 to 10.

2 Claims, No Drawings

RESIN COMPOSITION, RESIN SHEET, MULTILAYER PRINTED WIRING BOARD, AND SEMICONDUCTOR DEVICE

TECHNICAL FIELD

The present invention relates to a resin composition, a resin sheet, a multilayer printed wiring board, and a semiconductor device.

BACKGROUND ART

Due to the downsizing and densification of multilayer printed wiring boards, studies have been actively conducted to make the laminate used for multilayer printed wiring boards thinner. Along with the thinning, the insulating layer also needs to be made thinner, and a resin sheet not containing glass cloth has been demanded. The resin composition used as the material of the insulating layer is mainly a thermosetting resin, and drilling of holes between insulating layers to obtain conduction is generally carried out by laser processing.

Meanwhile, the drilling of holes by laser processing has a problem that the processing time becomes longer as the number of holes in a high density substrate becomes larger. In recent years, therefore, there has been a demand for a resin sheet that enables batch drilling in the exposure and development steps by using a resin composition in which an exposed portion is cured by irradiation of rays of light or the like (exposure step) and an unexposed portion can be removed (development step).

As the method of exposure, a method in which a mercury lamp is used as a light source and the exposure is carried out via a photomask is used. A material which can be suitably exposed in the method using a mercury lamp as a light source has been demanded. In the exposure method using a mercury lamp as a light source, a ghi line (a g-line with a wavelength of 436 nm, an h-line with a wavelength of 405 nm and an i-line with a wavelength of 365 nm) or the like is used, and a general-purpose photo initiator can be selected. Also, in recent years, the introduction of a direct imaging method, in which a pattern is directly drawn on the photosensitive resin composition layer without using a photomask, based on digital data of the pattern, has also been progressing as the exposure method. Since this direct imaging method provides better alignment accuracy than the exposure method using a photomask and produces a more detailed pattern, the introduction of this method has been progressing, especially for substrates that require the formation of high density wiring. The light source for this method is a monochromatic light source such as a laser, and in particular, a light source with a wavelength of 405 nm (h-line) is used in devices based on the DMD (Digital Micromirror Device) system, which is capable of forming highly detailed resist patterns.

For such photosensitive resin compositions used in laminates and resin sheets, compounds having an ethylenically unsaturated group, such as (meth)acrylate, are used in order to enable rapid curing in the exposure step.

For example, Patent Document 1 describes a photosensitive thermosetting resin composition containing a carboxyl modified epoxy (meth)acrylate resin, a biphenyl-based epoxy resin, a photo initiator, and a diluent, the carboxyl modified epoxy (meth)acrylate resin being obtained by reacting a bisphenol-based epoxy resin with (meth)acrylic acid and then reacting the resultant with an acid anhydride.

In addition, Patent Document 2 describes a resin composition containing a photocurable binder polymer, a photopolymerization compound having an ethylenically unsaturated bond, a photopolymerization (curing) initiator, a sensitizer, and a bisallylnadic imide compound and a bismaleimide compound, which are thermosetting agents.

Patent Document 3 describes a resin composition containing a bismaleimide compound (a curable resin) and a photo radical polymerization initiator (a curing agent) as a photosensitive resin composition used for laminates and resin sheets.

CITATION LIST

Patent Document

Patent Document 1: Japanese Patent Laid-Open No. 2005-62450
Patent Document 2: Japanese Patent Laid-Open No. 2010-204298
Patent Document 3: International Publication No. WO 2018/56466 (A1)

SUMMARY OF INVENTION

Technical Problem

However, cured products using conventional (meth)acrylate-based resins do not provide a sufficient physical property, and are limited in forming excellent protective films and interlayer insulating layers.

A cured product obtained from the resin composition described in Patent Document 1 is described as having excellent flexibility and folding resistance as a solder resist, and also having excellent heat resistance, but no specific values are given for heat resistance, and thus, it has a problem of inferior heat resistance and thermal stability for use as an interlayer insulating layer.

In Patent Document 2, the use of a bismaleimide compound is described as a thermosetting agent, and (meth)acrylate is used as a photopolymerizable compound. Therefore, it has a problem of inferior heat resistance and thermal stability for use as an interlayer insulating layer.

In Patent Document 3, a bismaleimide compound is used as a curable resin, but since the maleimide compound normally has poor light transmissivity, when the maleimide compound is contained, light does not reach the photo initiator sufficiently, the photo initiator has difficulty generating radicals, and its reactivity is very low. Therefore, in Patent Document 3, the maleimide compound is cured by additional heating before development, but highly detailed resist patterns cannot be obtained because heating is performed. In addition, in Patent Document 3, there is no description about using an active energy ray including a wavelength of 405 nm (h-line) as a light source that can be irradiated.

The present invention has been made in view of the problems described above, and an object of the present invention is to provide a resin composition which has excellent photocurability and can provide a cured product having excellent heat resistance, thermal stability, and insulation reliability in a well-balanced manner when used for a multilayer printed wiring board; and a resin sheet, a multilayer printed wiring board and a semiconductor device obtained using the resin composition.

Solution to Problem

The present inventors have found that the problems described above can be solved by using a resin composition comprising a particular bismaleimide compound (A), a particular resin or compound (B), and a photo initiator (C), leading to completion of the present invention.

More specifically, the present invention includes the following contents.

[1] A resin composition comprising:
a bismaleimide compound (A) comprising a constituent unit represented by the following formula (1), and maleimide groups at both ends of the molecular chain;
at least one resin or compound (B) selected from the group consisting of a maleimide compound other than the bismaleimide compound (A), a cyanate compound, a benzoxazine compound, an epoxy resin, a carbodiimide compound, and a compound having an ethylenically unsaturated group; and
a photo initiator (C):

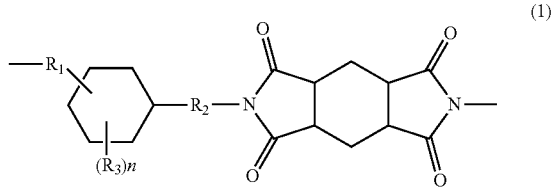

wherein $R_1$ represents a linear or branched alkylene group having 1 to 16 carbon atoms, or a linear or branched alkenylene group having 2 to 16 carbon atoms; $R_2$ represents a linear or branched alkylene group having 1 to 16 carbon atoms, or a linear or branched alkenylene group having 2 to 16 carbon atoms; each $R_3$ independently represents a hydrogen atom, a linear or branched alkyl group having 1 to 16 carbon atoms, or a linear or branched alkenyl group having 2 to 16 carbon atoms; and each n independently represents an integer of 1 to 10.

[2] The resin composition according to [1], wherein the photo initiator (C) comprises a compound represented by the following formula (2):

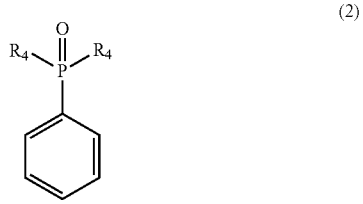

wherein each $R_4$ independently represents a substituent represented by the following formula (3) or a phenyl group; and

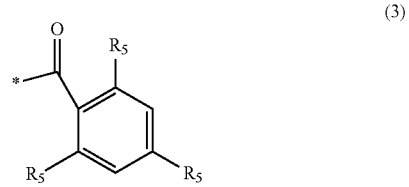

wherein -* represents a bonding hand, and each $R_5$ independently represents a hydrogen atom or a methyl group.

[3] A resin sheet comprising a support; and a resin layer disposed on one surface or both surfaces of the support, wherein the resin layer comprises the resin composition according to [1] or [2].

[4] The resin sheet according to [3], wherein the resin layer has a thickness of 1 to 50 μm.

[5] A multilayer printed wiring board comprising an insulating layer; and a conductor layer formed on one surface or both surfaces of the insulating layer, wherein the insulating layer comprises the resin composition according to [1] or [2].

[6] A semiconductor device comprising the resin composition according to [1] or [2].

ADVANTAGEOUS EFFECTS OF INVENTION

According to the present invention, it is possible to provide a resin composition which has excellent photocurability and can provide a cured product having excellent heat resistance, thermal stability, and insulation reliability in a well-balanced manner when used for a multilayer printed wiring board; and a resin sheet, a multilayer printed wiring board and a semiconductor device obtained using the resin composition.

Hereinafter, an embodiment for carrying out the present invention (hereinafter, referred to as the "present embodiment") will be described in detail. The present embodiment described below is only illustrative of the present invention and is not intended to limit the present invention to the contents of the following description. The present invention can be carried out with appropriate modifications falling within the gist of the invention.

Note that, in the present specification, the term "(meth) acryloxy" refers to both "acryloxy" and "methacryloxy" corresponding thereto, the term "(meth)acrylate" refers to both "acrylate" and "methacrylate" corresponding thereto, and the term "(meth)acryl" refers to both "acryl" and "methacryl" corresponding thereto.

[Resin Composition]

A resin composition of the present embodiment is a resin composition containing a particular bismaleimide compound (A) (also referred to as "component (A)"), at least one resin or compound (B) (also referred to as "component (B)" or "resin or compound (B)") selected from the group consisting of a maleimide compound other than the bismaleimide compound (A), a cyanate compound, a benzoxazine compound, an epoxy resin, a carbodiimide compound, and a compound having an ethylenically unsaturated group, and a photo initiator (C) (also referred to as "component (C)":
Hereinafter, each of these components will be described.

[Bismaleimide Compound (A)]

The resin composition contains a bismaleimide compound (A) (also referred to as component (A)). The bismaleimide compound (A) contains a constituent unit represented by the formula (1), and maleimide groups at both ends of the molecular chain.

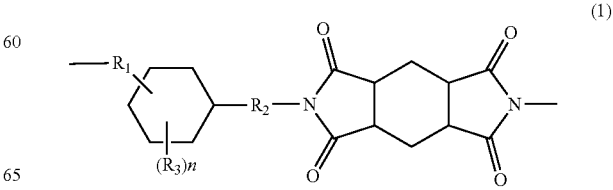

In the formula (1), $R_1$ represents a linear or branched alkylene group having 1 to 16 carbon atoms, or a linear or branched alkenylene group having 2 to 16 carbon atoms. $R_2$ represents a linear or branched alkylene group having 1 to 16 carbon atoms, or a linear or branched alkenylene group having 2 to 16 carbon atoms. Each $R_3$ independently represents a hydrogen atom, a linear or branched alkyl group having 1 to 16 carbon atoms, or a linear or branched alkenyl group having 2 to 16 carbon atoms. Each n independently represents an integer of 1 to 10.

Normally, since maleimide compounds have poor light transmissivity, when the resin composition contains a maleimide compound, light does not sufficiently reach the photo initiator dispersed in the resin composition, and the photo initiator has difficulty generating radicals. Therefore, in general, the photo radical reaction of maleimide compounds is difficult to proceed, and even if radical polymerization or dimerization reaction of single maleimide proceeds, its reactivity is very low. The bismaleimide compound (A) contains a constituent unit represented by the formula (1), and therefore has very excellent light transmittivity. Therefore, light reaches the photo initiator sufficiently, so that the photo radical reaction of the maleimide efficiently takes place. Using various active energy rays, the bismaleimide compound (A) can be photocured together with the later-described resin or compound (B) and the photo initiator (C).

In the present embodiment, the bismaleimide compound (A) exhibits very excellent light transmissivity, with a transmittance of 5% or more, when a chloroform solution containing the bismaleimide compound (A) at 1% by mass is prepared and the transmittance of the chloroform solution containing the bismaleimide compound (A) at 1% by mass is measured using an active energy ray including a wavelength of 365 nm (i-line). In addition, the bismaleimide compound (A) exhibits very excellent light transmissivity, with a transmittance of 5% or more, when the transmittance of the chloroform solution containing the bismaleimide compound (A) at 1% by mass is measured using an active energy ray (ray of light) including a wavelength of 405 nm (h-line). Therefore, for example, upon producing a printed wiring board having a highly dense and highly detailed wiring formation (pattern) using the direct imaging method, the photo radical reaction of the maleimide occurs efficiently even when an active energy ray including a wavelength of 405 nm (h-line) is used. The transmittance at a wavelength of 365 nm (i-line) is preferably 8% or more, more preferably 10% or more, from the viewpoint of exhibiting superior light transmittivity. The transmittance at a wavelength of 405 nm (h-line) is preferably 8% or more, more preferably 10% or more, from the viewpoint of producing a printed wiring board having a more highly dense and highly detailed wiring formation (pattern). The upper limit of each of the transmittance at a wavelength of 365 nm (i-line) and the transmittance at a wavelength of 405 nm (h-line) is, for example, 99.9% or less.

Normally, the absorbance of the photo initiator tends to decrease when a ray of light having a long wavelength is used. For example, when an active energy ray including a wavelength of 405 nm (h-line) is used, a usual photo initiator does not absorb the ray because light having such a wavelength has a relatively long wavelength, and polymerization proceeds only when a photo initiator capable of suitably absorbing the light to generate radicals is used. Therefore, as the later-described photo initiator (C), a photo initiator is preferably used which exhibits very excellent absorption of light with a wavelength of 405 nm (h-line), with an absorbance of 0.1 or more, when the absorbance of a chloroform solution containing the photo initiator (C) at 0.01% by mass is measured.

Since the bismaleimide compound (A) has excellent light transmissivity as mentioned above, light reaches the photo initiator sufficiently, for example, even when an active energy ray including a wavelength of 365 nm or an active energy ray including a wavelength of 405 nm is used, radical reaction using radicals generated from the photo initiator proceeds, and even a composition containing a large amount of the bismaleimide compound (A) can be photocured. Therefore, the resin composition of the present embodiment is excellent in photocurability.

On the other hand, the bismaleimide compound (A) has high heat resistance and thermal stability because it has a rigid imide ring even when photocured, but wrinkles occur when a cured product obtained by photocuring the bismaleimide compound is further cured by heating in a postbaking step or the like performed after the end of the exposure step or the end of the development step. Therefore, the cured product obtained by homopolymerizing the bismaleimide compound (A) is not suitable for application in multilayer printed wiring boards. However, by compounding the bismaleimide compound (A) together with the later-described resin or compound (B) and the photo initiator (C), the obtained cured product has excellent photocurability and insulation reliability, while having higher heat resistance and thermal stability. Therefore, cured products obtained from the resin composition of the present embodiment have excellent heat resistance, thermal stability, and insulation reliability and according to the present embodiment, protective films and insulating layers in multilayer printed wiring boards and semiconductor devices can be suitably formed.

The mass average molecular weight of the bismaleimide compound (A) is preferably 100 to 5000, and more preferably 300 to 4500 because a suitable viscosity can be obtained and an increase in viscosity of varnish can be suppressed. The term "mass average molecular weight" means a mass average molecular weight in terms of polystyrene standard by a gel permeation chromatography (GPC) method.

The structure of the bismaleimide compound (A) will now be described.

In the formula (1) of the bismaleimide compound (A), $R_1$ represents a linear or branched alkylene group having 1 to 16 carbon atoms, or a linear or branched alkenylene group having 2 to 16 carbon atoms. $R_1$ is preferably a linear or branched alkylene group, and more preferably a linear alkylene group because a suitable viscosity can be obtained and an increase in viscosity of varnish can be controlled.

The number of carbon atoms in the alkylene group is preferably 2 to 14, and more preferably 4 to 12 because a more suitable viscosity can be obtained and an increase in viscosity of varnish can be more reliably controlled.

Examples of the linear or branched alkylene group include a methylene group, an ethylene group, a propylene group, a 2,2-dimethylpropylene group, a butylene group, a pentylene group, a hexylene group, a heptylene group, an octylene group, a nonylene group, a decylene group, a dodecylene group, an undecylene group, a tridecylene group, a tetradecylene group, a pentadecylene group, a hexadecylene group, a neopentylene group, a dimethylbutylene group, a methylhexylene group, an ethylhexylene group, a dimethylhexylene group, a trimethylhexylene group, a methylheptylene group, a dimethylheptylene group, a trimethylheptylene group, a tetramethylheptylene group, an ethylheptylene group, a methyloctylene group, a methylnonylene group, a methyldecylene group, a methyldodecylene group, a methylundecylene group, a methyltridecylene group, a methyltetradecylene group and a methylpentadecylene group.

The number of carbon atoms in the alkenylene group is preferably 2 to 14, and more preferably 4 to 12 because a more suitable viscosity can be obtained and an increase in viscosity of varnish can be more reliably controlled.

Examples of the linear or branched alkenylene group include a vinylene group, a 1-methylvinylene group, an arylene group, a propenylene group, an isopropenylene group, a 1-butenylene group, a 2-butenylene group, a 1-pentenylene group, a 2-pentenylene group, an isopentylene group, a cyclopentenylene group, a cyclohexenylene group and a dicyclopentadienylene group.

In the formula (1), $R_2$ represents a linear or branched alkylene group having 1 to 16 carbon atoms, or a linear or branched alkenylene group having 2 to 16 carbon atoms. $R_2$ is preferably a linear or branched alkylene group, and more preferably a linear alkylene group because a suitable viscosity can be obtained and an increase in viscosity of varnish can be controlled.

The number of carbon atoms in the alkylene group is preferably 2 to 14, and more preferably 4 to 12 because a more suitable viscosity can be obtained and an increase in viscosity of varnish can be more reliably controlled.

For the linear or branched alkylene group, $R_1$ can be referred to.

The number of carbon atoms in the alkenylene group is preferably 2 to 14, and more preferably 4 to 12 because a more suitable viscosity can be obtained and an increase in viscosity of varnish can be more reliably controlled.

For the linear or branched alkenylene group, $R_1$ can be referred to.

In the formula (1), $R_1$ and $R_2$ may be the same or different, and are preferably the same because the bismaleimide compound (A) can be more easily synthesized.

In the formula (1), each $R_3$ independently represents a hydrogen atom, a linear or branched alkyl group having 1 to 16 carbon atoms, or a linear or branched alkenyl group having 2 to 16 carbon atoms. It is preferable that each $R_3$ be independently a hydrogen atom or a linear or branched alkyl group having 1 to 16 carbon atoms because a suitable viscosity can be obtained and an increase in viscosity of varnish can be controlled, it is more preferable that one to five groups ($R_3$s) among $R_3$s be linear or branched alkyl groups each having 1 to 16 carbon atoms, and other groups ($R_3$) be hydrogen atoms, and it is still more preferable that one to three groups ($R_3$s) among $R_3$s be linear or branched alkyl groups each having 1 to 16 carbon atoms, and other groups ($R_3$) be hydrogen atoms.

The number of carbon atoms in the alkyl group is preferably 2 to 14, and more preferably 4 to 12 because a more suitable viscosity can be obtained and an increase in viscosity of varnish can be more reliably controlled.

Examples of the linear or branched alkyl group include a methyl group, an ethyl group, a n-propyl group, an isopropyl group, a 1-ethylpropyl group, a n-butyl group, a 2-butyl group, an isobutyl group, a tert-butyl group, a n-pentyl group, a 2-pentyl group, a tert-pentyl group, a 2-methylbutyl group, a 3-methylbutyl group, a 2,2-dimethylpropyl group, a n-hexyl group, a 2-hexyl group, a 3-hexyl group, a n-heptyl group, a n-octyl group, a 2-methylpentyl group, a 3-methylpentyl group, a 4-methylpentyl group, a 2-methylpentan-3-yl group and a n-nonyl group.

The number of carbon atoms in the alkenyl group is preferably 2 to 14, and more preferably 4 to 12 because a more suitable viscosity can be obtained and an increase in viscosity of varnish can be more reliably controlled.

Examples of the linear or branched alkenyl group include a vinyl group, an allyl group, a 4-pentenyl group, an isopropenyl group, an isopentenyl group, a 2-heptenyl group, a 2-octenyl group and a 2-nonenyl group.

In the formula (1), each n independently represents an integer of 1 to 10.

The bismaleimide compound (A) has maleimide groups at both ends of the molecular chain. In the present embodiment, the term "both ends" means both ends of the molecular chain of the bismaleimide compound (A), and for example, when the structural unit represented by the formula (1) is present at an end of the molecular chain of the bismaleimide compound (A), the maleimide group is present at an end of the molecular chain of $R_1$, at an end of the molecular chain on the N atom of the maleimide ring, or at each of both the ends. The bismaleimide compound (A) may have maleimide groups at positions other than both ends of the molecular chain.

In the present embodiment, the maleimide group is represented by the formula (4), and the N atom is bonded to the molecular chain of the bismaleimide compound (A). In addition, the maleimide groups bonded to the bismaleimide compound (A) may be all the same or different, and the maleimide groups at both ends of the molecular chain are preferably the same.

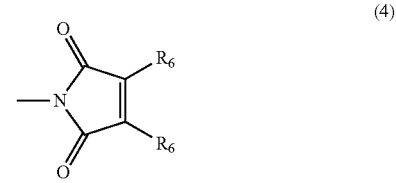

(4)

In the formula (4), each $R_6$ independently represents a hydrogen atom, or a linear or branched alkyl group having 1 to 4 carbon atoms. Each $R_6$ is preferably a hydrogen atom because photocuring is suitably performed.

The number of carbon atoms in the alkyl group is preferably 1 to 3, and more preferably 1 or 2 because photocuring is suitably performed.

For the linear or branched alkyl group, $R_3$ can be referred to.

Examples of such a bismaleimide compound (A) include a bismaleimide compound represented by the formula (5). One of these bismaleimide compounds can be used, or two or more thereof can be appropriately mixed and used.

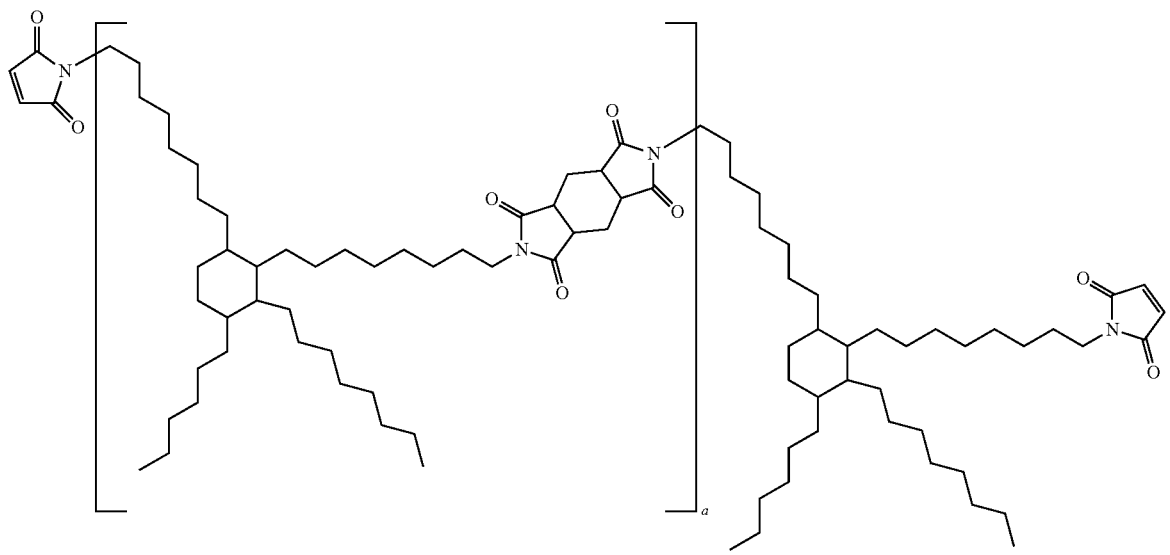

(5)

In the formula (5), a represents an integer of 1 to 10. a is preferably an integer of 1 to 6 because a more suitable viscosity can be obtained and an increase in viscosity of varnish can be more reliably controlled.

As the bismaleimide compound (A), commercial products can also be used. Examples of the commercial products include MIZ-001 manufactured by Nippon Kayaku Co., Ltd. (product name, containing the maleimide compound of the formula (5)).

In the resin composition of the present embodiment, the content of the bismaleimide compound (A) is preferably 5 to 99.4 parts by mass, more preferably 8 to 98 parts by mass, and still more preferably 17 to 93 parts by mass based on 100 parts by mass of the total of the bismaleimide compound (A), the later-described resin or compound (B), and the later-described photo initiator (C), from the viewpoint that it becomes possible to obtain a cured product mainly composed of the bismaleimide compounds and photocurability, heat resistance, and thermal stability can be improved in a well-balanced manner.

One of these bismaleimide compounds (A) can be used, or two or more thereof can be appropriately mixed and used.

(Method for Producing Bismaleimide Compound (A))
The bismaleimide compound (A) can be produced by a known method. For example, 1,2,4,5-cyclohexanetetracarboxylic dianhydride, a monomer containing a diamine including a dimer diamine or the like, and a maleimide compound such as maleimide anhydride are subjected to a polyaddition reaction at a temperature of normally about 80 to 250° C., preferably about 100 to 200° C. for normally about 0.5 to 50 hours, preferably about 1 to 20 hours to obtain a polyaddition product, and the polyaddition product is then subjected to an imidization reaction, i.e. a ring closure reaction with dehydration at a temperature of normally about 60 to 120° C., preferably about 80 to 100° C. for normally about 0.1 to 2 hours, preferably about 0.1 to 0.5 hours to obtain the bismaleimide compound (A).

The dimer diamine can be obtained by, for example, a reductive amination reaction of a dimer acid, and the amination reaction can be conducted by, for example, a known method such as a reduction method using ammonia and a catalyst (e.g. the method described in Japanese Patent Laid-Open No. 9-12712). The dimer acid is a dibasic acid obtained by dimerization of an unsaturated fatty acid through an intermolecular polymerization reaction or the like. Depending on synthesis conditions and purification conditions, a small amount of monomer acids, trimer acids or the like are normally contained in addition to the dimer acid. After the reaction, double bonds remain in the obtained molecule, and in the present embodiment, the dimer acids also include those formed into saturated dibasic acids by reduction of double bonds present in the molecule through a hydrogenation reaction. The dimer acid can be obtained by, for example, polymerizing an unsaturated fatty acid using Lewis acid and Broensted acid as catalysts. The dimer acid can be produced by a known method (e.g. the method described in Japanese Patent Laid-Open No. 9-12712). Examples of the unsaturated fatty acid include crotonic acid, myristoleic acid, palmitoleic acid, oleic acid, elaidic acid, vaccenic acid, gadoleic acid, eicosenoic acid, erucic acid, nervonic acid, linoleic acid, pinolenic acid, eleostearic acid, mead acid, dihomo-γ-linolenic acid, eicosatrienoic acid, stearidonic acid, arachidonic acid, eicosatetraenoic acid, adrenic acid, bosseopentaenoic acid, Osbond acid, clupanodonic acid, tetracosapentaenoic acid, docosahexaenoic acid and Nisinic acid. The number of carbon atoms in the unsaturated fatty acid is normally 4 to 24, and preferably 14 to 20.

In production of the bismaleimide compound (A), it is preferable that the monomer containing a diamine be dissolved or dispersed in a slurry form in an organic solvent in an inert atmosphere of, for example, argon, nitrogen or the like to form a monomer solution containing a diamine in advance. It is preferable that the 1,2,4,5-cyclohexanetetracarboxylic dianhydride be added to the monomer solution containing a diamine after being dissolved or dispersed in a slurry form in an organic solvent, or in a solid state.

A desired bismaleimide compound (A) can be obtained by adjusting the number of moles of the 1,2,4,5-cyclohexanetetracarboxylic dianhydride and the number of moles of the total amount of the monomer containing a diamine and the maleimide compound.

Various known solvents can be used for the polyaddition reaction and the imidization reaction. Examples of the solvent include amides such as N,N-dimethylformamide, N,N-dimethylacetamide and N-methyl-2-pyrrolidone; ketones such as acetone, methyl ethyl ketone, methyl isobutyl ketone, cyclohexanone and isophorone; esters such as γ-butyrolactone, γ-valerolactone, δ-valerolactone, γ-caprolactone, ε-caprolactone, α-methyl-γ-butyrolactone, ethyl lactate, methyl acetate, ethyl acetate and butyl acetate; aliphatic alcohols having 1 to 10 carbon atoms such as methanol, ethanol and propanol; aromatic group-containing phenols such as phenol and cresol; aromatic group-containing alcohols such as benzyl alcohol; glycols such as ethylene glycol and propylene glycol, monoethers or diethers of these glycols and methanol, ethanol, butanol, hexanol, octanol, benzyl alcohol, phenol, cresol and the like, or glycol ethers such as esters of these monoethers; ethers such as dioxane and tetrahydrofuran; cyclic carbonates such as ethylene carbonate and propylene carbonate; aliphatic hydrocarbons and aromatic hydrocarbons such as toluene and xylene; and aprotic polar solvents such as dimethylsulfoxide. One of these solvents can be used, or two or more thereof can be combined and used as necessary.

It is preferable to use a catalyst in the imidization reaction. As the catalyst, for example, tertiary amines and dehydration catalysts can be used. The tertiary amine is preferably a heterocyclic tertiary amine, and examples thereof include pyridine, picoline, quinoline and isoquinoline. Examples of the dehydration catalyst include acetic anhydride, propionic anhydride, n-butyric anhydride, benzoic anhydride and trifluoroacetic anhydride.

For the amount of the catalyst added, it is preferable that for example, the amount of an imidizing agent be about 0.5 to 5.0 times the amount of amide groups on a molar basis, and the amount of the dehydration catalyst be 0.5 to 10.0 times the amount of amide groups on a molar basis.

After completion of the imidization reaction, the solution may be used as a bismaleimide compound (A) solution, or a poor solvent may be added to the reaction solvent to form the bismaleimide compound (A) into a solid matter. Examples of the poor solvent include water, methyl alcohol, ethyl alcohol, 2-propyl alcohol, ethylene glycol, triethylene glycol, 2-butyl alcohol, 2-pentyl alcohol, 2-hexyl alcohol, cyclopentyl alcohol, cyclohexyl alcohol, phenol and t-butyl alcohol.

[Resin or Compound (B)]

The resin composition of the present embodiment contains at least one resin or compound (B) (also referred to as component (B)) selected from the group consisting of a maleimide compound other than the bismaleimide compound (A), a cyanate compound, a benzoxazine compound, an epoxy resin, a carbodiimide compound, and a compound having an ethylenically unsaturated group. One of these resins or compounds (B) can be used, or two or more thereof can be appropriately mixed and used according to the physical properties and application of the cured product to be obtained.

In the present embodiment, when the resin or compound (B) is used together with the bismaleimide compound (A) and the later-described photo initiator, photocurability, heat resistance, and thermal stability are excellent. The reason for this is not certain, but the present inventors presume that it is possible to achieve both the photocurability and insulation reliability of the bismaleimide compound (A) and the heat resistance and thermal stability of the resin or compound (B). In addition, various physical properties of the bismaleimide compound (A) and the resin or compound (B) can be imparted to the obtained cured product. The bismaleimide compound (A) has very excellent light transmittivity, so that even when the resin or compound (B) is used, light reaches the photo initiator sufficiently, the photo radical reaction of the maleimide efficiently takes place, and photocuring can be performed using various active energy rays. Therefore, light reaches the photo initiator sufficiently, for example, even when an active energy ray including a wavelength of 365 nm or an active energy ray including a wavelength of 405 nm is used, radical reaction using radicals generated from the photo initiator proceeds, and even a composition containing the resin or compound (B) can be photocured.

A cured product can be obtained by photocuring the resin or compound (B) together with the bismaleimide compound (A) and the photo initiator (C) using various active energy rays.

In the present embodiment, the resin or compound (B) has a transmittance of preferably 5% or more when a N-methylpyrrolidone solution containing the resin or compound (B) at 1% by mass is prepared respectively and the transmittance of the N-methylpyrrolidone solution containing the compound (B) containing one or more carboxy groups at 1% by mass is measured using an active energy ray including a wavelength of 365 nm (i-line). Such a resin or compound (B) exhibits very excellent light transmittivity. In addition, the resin or compound (B) has a transmittance of preferably 5% or more when the transmittance of a N-methylpyrrolidone solution containing the resin or compound (B) respectively at 1% by mass is measured using an active energy ray including a wavelength of 405 nm (h-line). Even in this case, very excellent light transmittivity is exhibited. When such a resin or compound (B) is used, for example, upon producing a printed wiring board having a highly dense and highly detailed wiring formation (pattern) using the direct imaging method, the photo radical reaction of the maleimide occurs efficiently even when an active energy ray including a wavelength of 405 nm (h-line) is used. The transmittance at a wavelength of 365 nm (i-line) is more preferably 8% or more, and still more preferably 10% or more, because a resin composition that is superior in photocurability can be obtained. The transmittance at a wavelength of 405 nm (h-line) is more preferably 8% or more, and still more preferably 10% or more, because a resin composition that is superior in photocurability can be obtained. The upper limit of each of the transmittance at a wavelength of 365 nm (i-line) and the transmittance at a wavelength of 405 nm (h-line) is, for example, 99.9% or less.

The resin or compound (B) preferably has a molecular weight of 100 to 5000 from the viewpoint that an increase in the viscosity of the varnish can be suppressed. In addition, although the resin or compound (B) is not particularly limited as long as the effect of the present invention is achieved, it preferably has a mass average molecular weight of 100 to 50,000 from the viewpoint that an increase in the viscosity of the varnish can be suppressed. In the present embodiment, the term "mass average molecular weight" means a mass average molecular weight in terms of polystyrene standard by a gel permeation chromatography (GPC) method.

In the resin composition, the total content of the resin or compound (B) is preferably 0.5 to 85 parts by mass, more preferably 1 to 84 parts by mass, and still more preferably 5 to 76 parts by mass based on 100 parts by mass of the total of the bismaleimide compound (A), the resin or compound (B) and the later-described photo initiator (C), from the viewpoint that it becomes possible to obtain a cured product mainly composed of the bismaleimide compounds and photocurability is improved.

(Maleimide Compound Other than Bismaleimide Compound (A))

For the resin composition, a maleimide compound (B1) (also referred to as component (B1)) other than the bismaleimide compound (A) can be used. The maleimide compound (B1) will be described below.

The maleimide compound (B1) is not particularly limited as long as it is a compound other than the maleimide compound (A) and has one or more maleimide groups in the molecule. Specific examples thereof include N-phenylmaleimide, N-cyclohexylmaleimide, N-hydroxyphenylmaleimide, N-anilinophenylmaleimide, N-carboxyphenylmaleimide, N-(4-carboxy-3-hydroxyphenyl)maleimide, 6-maleimidohexanoic acid, 4-maleimidobutyric acid, bis(4-maleimidophenyl)methane, 2,2-bis{4-(4-maleimidophenoxy)-phenyl}propane, 4,4-diphenylmethanebismaleimide, bis(3,5-dimethyl-4-maleimidophenyl)methane, bis(3-ethyl-5-methyl-4-maleimidophenyl)methane, bis(3,5-diethyl-4-maleimidophenyl)methane, phenylmethanemaleimide, o-phenylenebismaleimide, m-phenylenebismaleimide, p-phenylenebismaleimide, o-phenylenebiscitraconimide, m-phenylenebiscitraconimide, p-phenylenebiscitraconimide, 2,2-bis(4-(4-maleimidophenoxy)-phenyl)propane, 3,3-dimethyl-5,5-diethyl-4,4-diphenylmethanebismaleimide, 4-methyl-1,3-phenylenebismaleimide, 1,2-bis(maleimido) ethane, 1,4-bis(maleimido)butane, 1,5-bis(maleimido)pentane, 1,5-bismaleimido-2-methylpentane, 1,6-bis(maleimido)hexane, 1,6-bismaleimido-(2,2,4-trimethyl)hexane, 1,8-bismaleimido-3,6-dioxaoctane, 1,11-bismaleimido-3,6,9-trioxaundecane, 1,3-bis(maleimidomethyl)cyclohexane, 1,4-bis(maleimidomethyl)cyclohexane, 4,4-diphenyl ether bismaleimide, 4,4-diphenyl sulfone bismaleimide, 1,3-bis(3-maleimidophenoxy)benzene, 1,3-bis(4-maleimidophenoxy)benzene, 4,4-diphenylmethanebiscitraconimide, 2,2-bis[4-(4-citraconimidophenoxy)phenyl]propane, bis(3,5-dimethyl-4-citraconimidophenyl)methane, bis(3-ethyl-5-methyl-4-citraconimidophenyl)methane, bis(3,5-diethyl-4-citraconimidophenyl)methane, polyphenylmethanemaleimide, a maleimide compound represented by the formula (6) such as polyphenylmethanemaleimide, a maleimide compound represented by the formula (7), fluorescein-5-maleimide, as well as a prepolymer of these maleimide compounds, or a prepolymer of maleimide compounds and amine compounds. One of these maleimide compounds (B1) can be used, or two or more thereof can be appropriately mixed and used.

As the maleimide compound represented by the formula (6), commercial products can also be used. Examples thereof include BMI-2300 (product name) manufactured by Daiwakasei Industry Co., LTD. As the maleimide compound represented by the formula (7), commercial products can also be used. Examples thereof include MIR-3000 (product name) manufactured by Nippon Kayaku Co., Ltd.

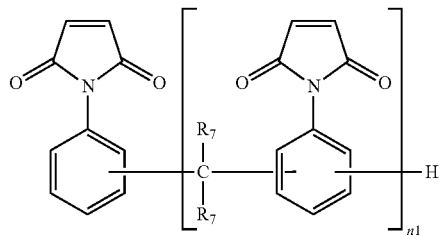

(6)

In the formula (6), each $R_7$ independently represents a hydrogen atom or a methyl group. $n_1$ represents an integer of 1 or more, preferably represents an integer of 1 to 10, and more preferably represents an integer of 1 to 5.

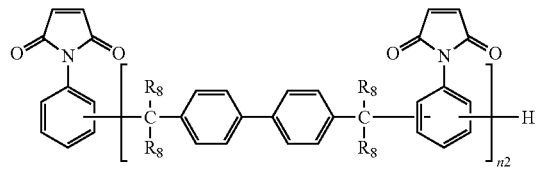

(7)

In the formula (7), each $R_8$ independently represents a hydrogen atom or a methyl group. $n_2$ represents an integer of 1 or more and preferably represents an integer of 1 to 5.

In the present embodiment, for the photo radical reaction of the bismaleimide compound (A) to occur efficiently, it is preferable that the maleimide compound (B1) exhibit light transmittivity with a transmittance of 5% or more when a chloroform solution containing the maleimide compound (B1) at 1% by mass is prepared and the transmittance of the chloroform solution is measured using an active energy ray including a wavelength of 365 nm (i-line). The transmittance in this case is more preferably 8% or more, and still more preferably 10% or more.

Further, for the photo radical reaction of the bismaleimide compound (A) to occur efficiently, it is preferable that the maleimide compound (B1) exhibit light transmittivity with a transmittance of 5% or more when a chloroform solution containing the maleimide compound (B1) at 1% by mass is prepared and the transmittance of the chloroform solution is measured using an active energy ray including a wavelength of 405 nm (h-line). When such a maleimide compound (B1) is used, for example, upon producing a printed wiring board having a highly dense and highly detailed wiring formation (pattern) using the direct imaging method, the photo radical reaction of the maleimide occurs efficiently even when an active energy ray including a wavelength of 405 nm (h-line) is used. The light transmittance is more preferably 8% or more, and still more preferably 10% or more, because a resin composition that is superior in photocurability can be obtained.

Examples of the maleimide compound (B1) include, a maleimide compound represented by the formula (8), a maleimide compound represented by the formula (9), a maleimide compound represented by the formula (10) such as a maleimide compound represented by the formula (16), a maleimide compound represented by the formula (11), a maleimide compound represented by the formula (12), a maleimide compound represented by the formula (13), 1,6-bismaleimide-(2,2,4-trimethyl)hexane (a maleimide compound represented by the formula (14)), a maleimide compound represented by the formula (15), and fluorescein-5-maleimide.

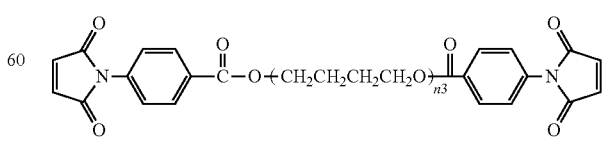

(8)

In the formula (8), $n_3$ (average) is 1 or more, preferably 1 to 21, and from the viewpoint of exhibiting excellent photocurability, more preferably 1 to 16.

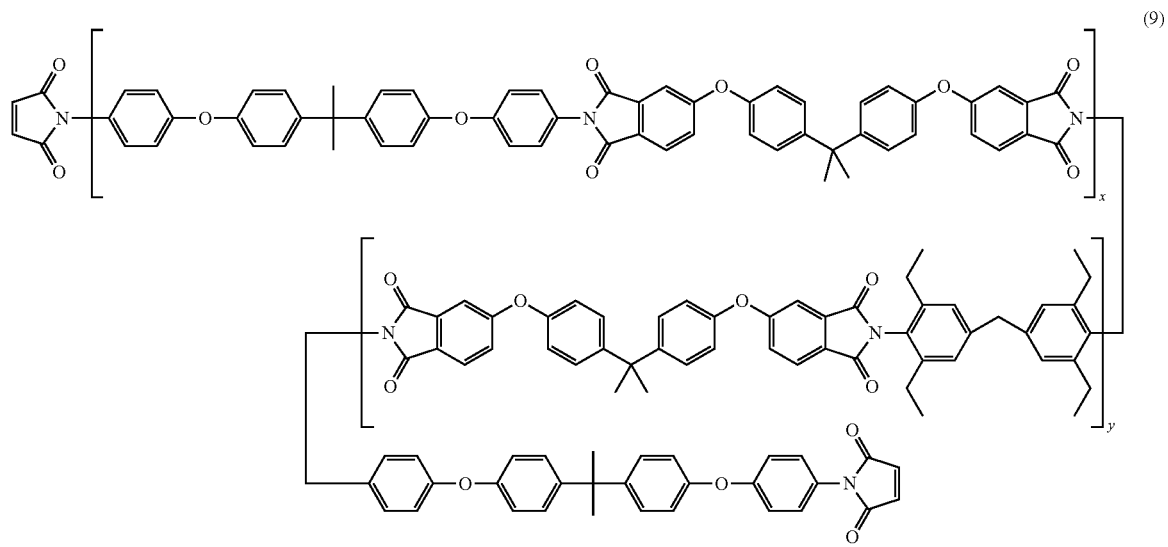

In the formula (9), the value of x is 10 to 35.
In the formula (9), the value of y is 10 to 35.

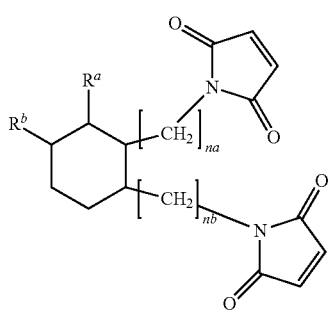

In the formula (10), $R^a$ represents a linear or branched alkyl group having 1 to 16 carbon atoms, or a linear or branched alkenyl group having 2 to 16 carbon atoms. $R^a$ is preferably a linear or branched alkyl group, and more preferably a linear alkyl group because excellent photocurability is exhibited.

The number of carbon atoms in the alkyl group is preferably 4 to 12 because excellent photocurability is exhibited.

The number of carbon atoms in the alkenyl group is preferably 4 to 12 because excellent photocurability is exhibited.

For the linear or branched alkyl group, $R_3$ in the bismaleimide compound (A) can be referred to. Among the above, since excellent photocurability is exhibited, a n-heptyl group, a n-octyl group, and a n-nonyl group are preferable, and a n-octyl group is more preferable.

For the linear or branched alkenyl group, $R_3$ in the bismaleimide compound (A) can be referred to. Among the above, since excellent photocurability is exhibited, a 2-heptenyl group, a 2-octenyl group, and a 2-nonenyl group are preferable, and a 2-octenyl group is more preferable.

In the formula (10), Rb represents a linear or branched alkyl group having 1 to 16 carbon atoms, or a linear or branched alkenyl group having 2 to 16 carbon atoms. Rb is preferably a linear or branched alkyl group, and more preferably a linear alkyl group because excellent photocurability is exhibited.

The number of carbon atoms in the alkyl group is preferably 4 to 12 because excellent photocurability is exhibited.

The number of carbon atoms in the alkenyl group is preferably 4 to 12 because excellent photocurability is exhibited.

As specific examples of the alkyl group, the alkyl groups in $R^a$ can be referred to. Among the above, since excellent photocurability is exhibited, a n-heptyl group, a n-octyl group, and a n-nonyl group are preferable, and a n-octyl group is more preferable.

As specific examples of the alkenyl group, the alkenyl groups in $R^a$ can be referred to. Among the above, since excellent photocurability is exhibited, a 2-heptenyl group, a 2-octenyl group, and a 2-nonenyl group are preferable, and a 2-octenyl group is more preferable.

In the formula (10), the value of $n_a$ is 1 or more, preferably 2 to 16, and from the viewpoint of exhibiting excellent photocurability, more preferably 3 to 14.

In the formula (10), the value of $n_b$ is 1 or more, preferably 2 to 16, and from the viewpoint of exhibiting excellent photocurability, more preferably 3 to 14.

The values of $n_a$ and $n_b$ may be the same, or may be different.

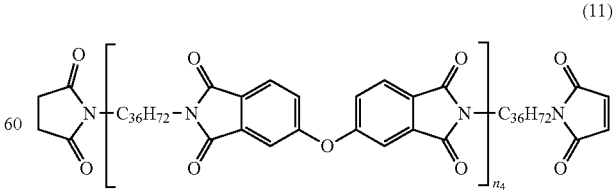

In the formula (11), $n_4$ (average) is 0.5 or more, preferably 0.8 to 10, and from the viewpoint of exhibiting excellent photocurability, more preferably 1 to 8.

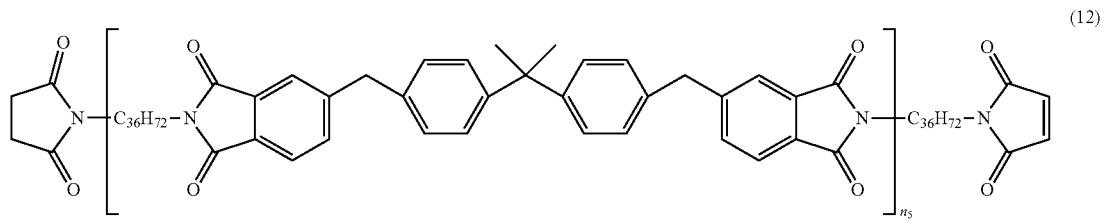

In the formula (12), $n_5$ represents an integer of 1 or more and preferably represents an integer of 1 to 10.

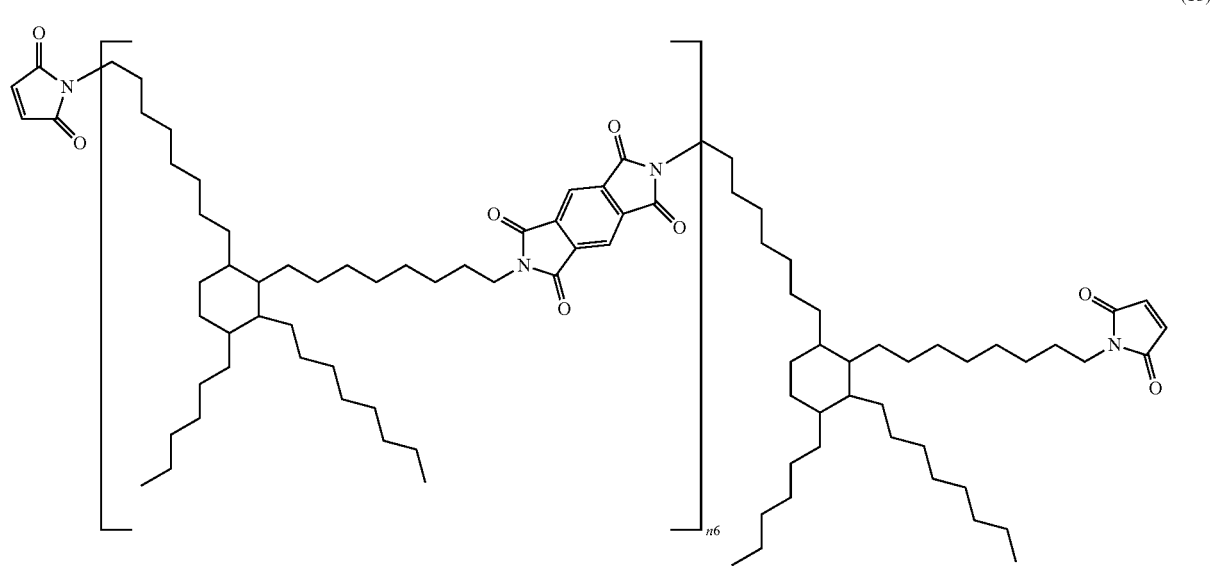

In the formula (13), $n_6$ represents an integer of 1 or more and preferably represents an integer of 1 to 10.

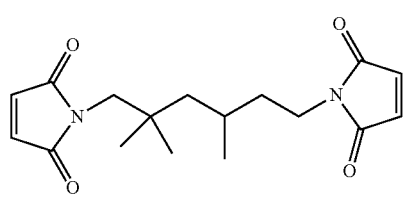

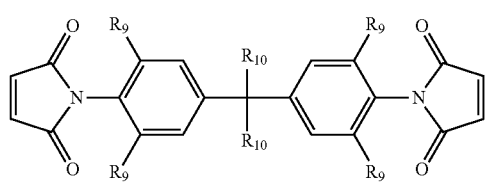

In the above formula (15), wherein each $R_9$ independently represents a hydrogen atom, a methyl group or an ethyl group, and each $R_{10}$ independently represents a hydrogen atom or a methyl group.

As the maleimide compound (B1), commercial products can also be used.

Examples of the maleimide compound represented by the formula (8) include, for example, BMI-1000P (product name, $n_3$=13.6 (average) in the formula (8)) manufactured by K·I Chemical Industry Co., LTD., BMI-650P (product name, $n_3$=8.8 (average) in the formula (8)) manufactured by K·I Chemical Industry Co., LTD., BMI-250P (product name, $n_3$=3 to 8 (average) in the formula (8)) manufactured by K·I Chemical Industry Co., LTD., and CUA-4 (product name, $n_3$=1 in the formula (8)) manufactured by K·I Chemical Industry Co., LTD.

Examples of the maleimide compound represented by the formula (9) include, for example, BMI-6100 (product name, x=18 and y=18 in the formula (9)) manufactured by Designer Molecules Inc.

Examples of the maleimide compound represented by the formula (10) include, for example, BMI-689 (product name, the formula (16), functional group equivalent: 346 g/eq.) manufactured by Designer Molecules Inc.

(16)

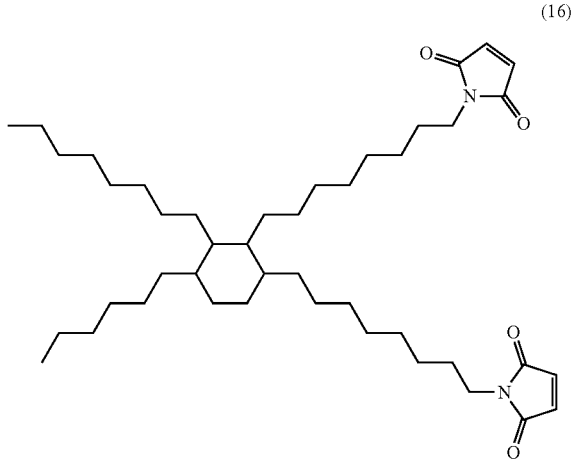 [SMILES: CCCCCCCCC1C(CCCCCC)CCC(CCCCCCCCN2C(=O)C=CC2=O)C1CCCCCCCCN1C(=O)C=CC1=O]

Examples of the maleimide compound represented by the formula (11) include, for example, BMI-1500 (product name, $n_4$=1.3 in the formula (11), functional group equivalent: 754 g/eq.) manufactured by Designer Molecules Inc.

As the maleimide compound represented by the formula (12), commercial products can also be used. Examples thereof include BMI-1700 (product name) manufactured by Designer Molecules Inc (DMI).

As the maleimide compound represented by the formula (13), commercial products can also be used. Examples thereof include BMI-3000 (product name) manufactured by Designer Molecules Inc. (DMI), BMI-5000 (product name) manufactured by Designer Molecules Inc. (DMI), and BMI-9000 (product name) manufactured by Designer Molecules Inc (DMI).

As the maleimide compound represented by the formula (14), commercial products can also be used. Examples thereof include BMI-TMH (product name) manufactured by Daiwakasei Industry Co., LTD.

As the maleimide compound represented by the formula (15), commercial products can also be used. Examples thereof include BMI-70 (product name) manufactured by K·I Chemical Industry Co., LTD.

One of these maleimide compounds (B1) can be used, or two or more thereof can be appropriately mixed and used.

In the resin composition, the content of the maleimide compound (B1) is preferably 0.5 to 85 parts by mass based on 100 parts by mass of the total of the bismaleimide compound (A), the maleimide compound (B1), and the photo initiator (C).

(Cyanate Compound)

For the resin composition, a cyanate compound (B2) (also referred to as component (B2)) can be used. The cyanate compound (B2) will be described below.

The cyanate compound is not particularly limited as long as it is a resin having in the molecule an aromatic moiety substituted by at least one cyanate group (cyanate group).

For example, mention may be made of those represented by the formula (17).

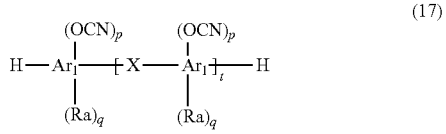

(17)

In the formula (17), $Ar_1$ represents a benzene ring, a naphthalene ring, or two benzene rings bonded to each other by a single bond. When there are a plurality of $Ar_1$, $Ar_1$ may be the same as or different from each other. $Ar_1$ is preferably a naphthalene ring. Each Ra independently represents a hydrogen atom, an alkyl group having 1 to 6 carbon atoms, an alkenyl group having 2 to 6 carbon atoms, an aryl group having 6 to 12 carbon atoms, an alkoxyl group having 1 to 4 carbon atoms, or a group in which an alkyl group having 1 to 6 carbon atoms and an aryl group having 6 to 12 carbon atoms are bonded to each other. Ra is preferably a hydrogen atom. The aromatic ring for Ra may have a substituent, and any position can be selected for the substituents in $Ar_1$ and Ra. p represents the number of cyanate groups bonded to $Ar_1$ and is each independently an integer of 1 to 3, and is preferably 1. q represents the number of Ra bonded to $Ar_1$ and is 4−p when $Ar_1$ is a benzene ring, 6−p when $Ar_1$ is a naphthalene ring, and 8−p when $Ar_1$ is two benzene rings bonded to each other by a single bond. t represents the average number of repetitions and is an integer of 0 to 50, preferably an integer of 1 to 30, and more preferably an integer of 1 to 10. The cyanate compound may be a mixture of compounds having different t. X represents any of a single bond, a divalent organic group having 1 to 50 carbon atoms (a hydrogen atom may be replaced by a heteroatom), a divalent organic group having 1 to 10 nitrogen atoms (for example, —N—R—N— (wherein R represents an organic group)), a carbonyl group (—CO—), a carboxy group (—C(=O)O—), a carbonyl dioxide group (—OC(=O)O—), a sulfonyl group (—$SO_2$—), a divalent sulfur atom, and a divalent oxygen atom, and X is each independently as defined above when there are a plurality of X.

The alkyl group for Ra in the formula (17) may have either a linear or branched chain structure or a cyclic structure (for example, a cycloalkyl group).

In addition, a hydrogen atom in the alkyl group and the aryl group for Ra in the formula (17) may be replaced by a halogen atom such as a fluorine atom or a chlorine atom; an alkoxyl group such as a methoxy group or a phenoxy group; a cyano group, or the like.

Specific examples of the alkyl group include a methyl group, an ethyl group, a propyl group, an isopropyl group, a n-butyl group, an isobutyl group, a tert-butyl group, a n-pentyl group, a 1-ethylpropyl group, a 2,2-dimethylpropyl group, a cyclopentyl group, a hexyl group, a cyclohexyl group, and a trifluoromethyl group.

Specific examples of the alkenyl group include a vinyl group, a (meth)allyl group, an isopropenyl group, a 1-propenyl group, a 2-butenyl group, a 3-butenyl group, a 1,3-butanedienyl group, 2-methyl-2-propenyl, a 2-pentenyl group, and a 2-hexenyl group.

Specific examples of the aryl group include a phenyl group, a xylyl group, a mesityl group, a naphthyl group, a phenoxyphenyl group, an ethylphenyl group, an o-, m-, or p-fluorophenyl group, a dichlorophenyl group, a dicyanophenyl group, a trifluorophenyl group, a methoxyphenyl group, and an o-, m-, or p-tolyl group. Furthermore, examples of the alkoxyl group include a methoxy group, an ethoxy group, a propoxy group, an isopropoxy group, a n-butoxy group, an isobutoxy group, and a tert-butoxy group.

Specific examples of the divalent organic group having 1 to 50 carbon atoms for X in the formula (17) include a methylene group, an ethylene group, a trimethylene group, a cyclopentylene group, a cyclohexylene group, a trimethylcyclohexylene group, a biphenylylmethylene group, a dimethylmethylene-phenylene-dimethylmethylene group, a methylene-phenylene-methylene group, a fluorenediyl group, and a phthalidediyl group. Among the above, a methylene-phenylene-methylene group is preferable. A hydrogen atom in the divalent organic group may be replaced by a halogen atom such as a fluorine atom or a chlorine atom; an alkoxyl group such as a methoxy group or a phenoxy group; a cyano group, or the like.

Examples of the divalent organic group having 1 to 10 nitrogen atoms for X in the formula (17) include an imino group and a polyimide group.

In addition, examples of the organic group of X in the formula (17) include one having a structure represented by the formula (18) or the formula (19).

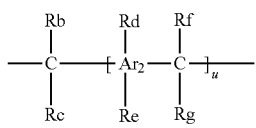
(18)

In the formula (18), Ar$_2$ represents a benzenediyl group, a naphthalenediyl group, or a biphenyldiyl group, and may be the same as or different from each other when u is an integer of 2 or more. Rb, Rc, Rf, and Rg each independently represent a hydrogen atom, an alkyl group having 1 to 6 carbon atoms, an aryl group having 6 to 12 carbon atoms, a trifluoromethyl group, or an aryl group having at least one phenolic hydroxy group. Rd and Re are each independently selected from any one of a hydrogen atom, an alkyl group having 1 to 6 carbon atoms, an aryl group having 6 to 12 carbon atoms, an alkoxyl group having 1 to 4 carbon atoms, and a hydroxy group. u represents an integer of 0 to 5.

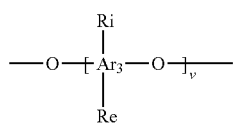
(19)

In the formula (19), Ar$_3$ represents a benzenediyl group, a naphthalenediyl group, or a biphenyldiyl group, and may be the same as or different from each other when v is an integer of 2 or more. Ri and Rj each independently represent a hydrogen atom, an alkyl group having 1 to 6 carbon atoms, an aryl group having 6 to 12 carbon atoms, a benzyl group, an alkoxyl group having 1 to 4 carbon atoms, a hydroxy group, a trifluoromethyl group, or an aryl group substituted by at least one cyanate group. v represents an integer of 0 to 5, and the cyanate compound may be a mixture of compounds having different v.

Furthermore, examples of X in the formula (17) include divalent groups represented by the formulas.

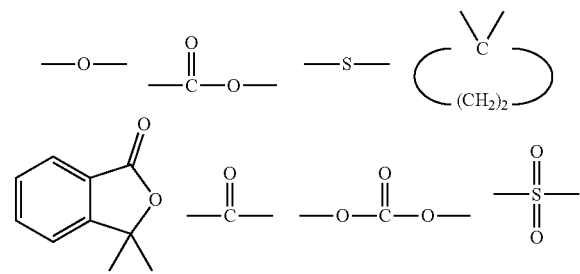

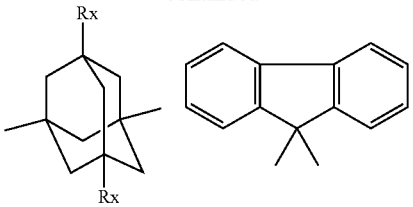

Here, in the above formula, z represents an integer of 4 to 7. Each Rk independently represents a hydrogen atom or an alkyl group having 1 to 6 carbon atoms.

Specific examples of Ar$_2$ in the formula (18) and Ar$_3$ in the formula (19) include a benzenediyl group to which two carbon atoms shown in the formula (18) or two oxygen atoms shown in the formula (19) are bonded at positions 1 and 4 or positions 1 and 3, a biphenyldiyl group to which the above two carbon atoms or two oxygen atoms are bonded at positions 4 and 4', positions 2 and 4', positions 2 and 2', positions 2 and 3', positions 3 and 3', or positions 3 and 4', and a naphthalenediyl group to which the above two carbon atoms or two oxygen atoms are bonded at positions 2 and 6, positions 1 and 5, positions 1 and 6, positions 1 and 8, positions 1 and 3, positions 1 and 4, or positions 2 and 7.

The alkyl group and the aryl group for Rb, Rc, Rd, Re, Rf, and Rg in the formula (18) and Ri and Rj in the formula (19) have the same meanings as those in the above formula (17).

Specific examples of the cyanato-substituted aromatic compound represented by the above formula (17) include cyanatobenzene, 1-cyanato-2-, 1-cyanato-3-, or 1-cyanato-4-methylbenzene, 1-cyanato-2-, 1-cyanato-3-, or 1-cyanato-4-methoxybenzene, 1-cyanato-2,3-, 1-cyanato-2,4-, 1-cyanato-2,5-, 1-cyanato-2,6-, 1-cyanato-3,4-, or 1-cyanato-3,5-dimethylbenzene, cyanatoethylbenzene, cyanatobutylbenzene, cyanatooctylbenzene, cyanatononylbenzene, 2-(4-cyanaphenyl)-2-phenylpropane (a cyanate of 4-α-cumylphenol), 1-cyanato-4-cyclohexylbenzene, 1-cyanato-4-vinylbenzene, 1-cyanato-2- or 1-cyanato-3-chlorobenzene, 1-cyanato-2,6-dichlorobenzene, 1-cyanato-2-methyl-3-chlorobenzene, cyanatonitrobenzene, 1-cyanato-4-nitro-2-ethylbenzene, 1-cyanato-2-methoxy-4-allylbenzene (a cyanate of eugenol), methyl(4-cyanatophenyl)sulfide, 1-cyanato-3-trifluoromethylbenzene, 4-cyanatobiphenyl, 1-cyanato-2- or 1-cyanato-4-acetylbenzene, 4-cyanatobenzaldehyde, methyl 4-cyanatobenzoate ester, phenyl 4-cyanatobenzoate ester, 1-cyanato-4-acetaminobenzene, 4-cyanatobenzophenone, 1-cyanato-2,6-di-tert-butylbenzene, 1,2-dicyanatobenzene, 1,3-dicyanatobenzene, 1,4-dicyanatobenzene, 1,4-dicyanato-2-tert-butylbenzene, 1,4-dicyanato-2,4-dimethylbenzene, 1,4-dicyanato-2,3,4-dimethylbenzene, 1,3-dicyanato-2,4,6-trimethylbenzene, 1,3-dicyanato-5-methylbenzene, 1-cyanato- or 2-cyanatonaphthalene, 1-cyanato-4-methoxynaphthalene, 2-cyanato-6-methoxynaphthalene, 2-cyanato-7-methoxynaphthalene, 2,2'-dicyanato-1,1'-binaphthyl, 1,3-, 1,4-, 1,5-, 1,6-, 1,7-, 2,3-, 2,6-, or 2,7-dicyanatonaphthalene, 2,2'- or 4,4'-dicyanatobiphenyl, 4,4'-dicyanatooctafluorobiphenyl, 2,4'- or 4,4'-dicyanatodiphenylmethane, bis(4-cyanato-3,5-dimethylphenyl)methane, 1,1-bis(4-cyanatophenyl)ethane, 1,1-bis(4-cyanatophenyl)propane, 2,2-bis(4-cyanatophenyl)propane, 2,2-bis(4-cyanato-3-methylphenyl)propane, 2,2-bis(2-cyanato-5-biphenylyl)propane, 2,2-bis(4-cyanatophenyl)hexafluoropropane, 2,2-bis(4-cyanato-3,5-dimethylphenyl)propane, 1,1-bis(4-cyanatophenyl)butane, 1,1-bis(4-cyanatophenyl)isobutane, 1,1-bis(4-cyanatophenyl)pentane, 1,1-bis(4-cyanatophenyl)-3-methylbutane, 1,1-bis(4-cyanatophenyl)-2-methylbutane, 1,1-bis(4-cyanatophenyl)-2,2-dimethylpropane, 2,2-bis(4-cyanatophenyl)butane, 2,2-bis(4-cyanatophenyl)pentane, 2,2-bis(4-cyanatophenyl)hexane, 2,2-bis(4-cyanatophenyl)-3-methylbutane, 2,2-bis(4-cyanatophenyl)-4-methylpentane, 2,2-bis(4-cyanatophenyl)-3,3-dimethylbutane, 3,3-bis(4-cyanatophenyl)hexane, 3,3-bis(4-cyanatophenyl)heptane, 3,3-bis(4-cyanatophenyl)octane, 3,3-bis(4-cyanatophenyl)-2-methylpentane, 3,3-bis(4-cyanatophenyl)-2-methylhexane, 3,3-bis(4-cyanatophenyl)-2,2-dimethylpentane, 4,4-bis(4-cyanatophenyl)-3-methylheptane, 3,3-bis(4-cyanatophenyl)-2-methylheptane, 3,3-bis(4-cyanatophenyl)-2,2-dimethylhexane, 3,3-bis(4-cyanatophenyl)-2,4-dimethylhexane, 3,3-bis(4-cyanatophenyl)-2,2,4-trimethylpentane, 2,2-bis(4-cyanatophenyl)-1,1,1,3,3,3-hexafluoropropane, bis(4-cyanatophenyl)phenylmethane, 1,1-bis(4-cyanatophenyl)-1-phenylethane, bis(4-cyanatophenyl)biphenylmethane, 1,1-bis(4-cyanatophenyl)cyclopentane, 1,1-bis(4-cyanatophenyl)cyclohexane, 2,2-bis(4-cyanato-3-isopropylphenyl)propane, 1,1-bis(3-cyclohexyl-4-cyanatophenyl)cyclohexane, bis(4-cyanatophenyl)diphenylmethane, bis(4-cyanatophenyl)-2,2-dichloroethylene, 1,3-bis[2-(4-cyanatophenyl)-2-propyl]benzene, 1,4-bis[2-(4-cyanatophenyl)-2-propyl]benzene, 1,1-bis(4-cyanatophenyl)-3,3,5-trimethylcyclohexane, 4-[bis(4-cyanatophenyl)methyl]biphenyl, 4,4-dicyanatobenzophenone, 1,3-bis(4-cyanatophenyl)-2-propen-1-one, bis(4-cyanatophenyl) ether, bis(4-cyanatophenyl) sulfide, bis(4-cyanatophenyl) sulfone, 4-cyanatobenzoic acid-4-cyanatophenyl ester (4-cyanatophenyl-4-cyanatobenzoate), bis-(4-cyanatophenyl) carbonate, 1,3-bis(4-cyanatophenyl)adamantane, 1,3-bis(4-cyanatophenyl)-5,7-dimethyladamantane, 3,3-bis(4-cyanatophenyl)isobenzofuran-1(3H)-one (a cyanate of phenolphthalein), 3,3-bis(4-cyanato-3-methylphenyl)isobenzofuran-1(3H)-one (a cyanate of o-cresolphthalein), 9,9'-bis(4-cyanatophenyl)fluorene, 9,9-bis(4-cyanato-3-methylphenyl)fluorene, 9,9-bis(2-cyanato-5-biphenylyl)fluorene, tris(4-cyanatophenyl)methane, 1,1,1-tris(4-cyanatophenyl)ethane, 1,1,3-tris(4-cyanatophenyl)propane, α,α,α'-tris(4-cyanatophenyl)-1-ethyl-4-isopropylbenzene, 1,1,2,2-tetrakis(4-cyanatophenyl)ethane, tetrakis(4-cyanatophenyl)methane, 2,4,6-tris(N-methyl-4-cyanatoanilino)-1,3,5-triazine, 2,4-bis(N-methyl-4-cyanatoanilino)-6-(N-methylanilino)-1,3,5-triazine, bis(N-4-cyanato-2-methylphenyl)-4,4'-oxydiphthalimide, bis(N-3-cyanato-4-methylphenyl)-4,4'-oxydiphthalimide, bis(N-4-cyanatophenyl)-4,4'-oxydiphthalimide, bis(N-4-cyanato-2-methylphenyl)-4,4'-(hexafluoroisopropylidene)diphthalimide, tris(3,5-dimethyl-4-cyanatobenzyl)isocyanurate, 2-phenyl-3,3-bis(4-cyanatophenyl)phthalimidine, 2-(4-methylphenyl)-3,3-bis(4-cyanatophenyl)phthalimidine, 2-phenyl-3,3-bis(4-cyanato-3-methylphenyl)phthalimidine, 1-methyl-3,3-bis(4-cyanatophenyl)indolin-2-one, 2-phenyl-3,3-bis(4-cyanatophenyl)indolin-2-one, and α-naphthol aralkyl-based cyanate resin. Among the above, α-naphthol aralkyl-based cyanate resins represented by the formula (31) (including those having $n_{13}$ of 1 to 4 in the formula (31)) are preferable because the heat resistance of the cured product is improved.

One of these cyanate compounds can be used, or two or more thereof can be appropriately mixed and used.

Other specific examples of the cyanate compound represented by the formula (17) include those obtained by cyanation of a phenolic resin such as a phenol novolac resin and a cresol novolac resin (those obtained by reacting phenol, an alkyl-substituted phenol or a halogen-substituted phenol with a formaldehyde compound such as formalin or paraformaldehyde in an acidic solution, using a publicly known method), a trisphenol novolac resin (those obtained by reacting hydroxybenzaldehyde with phenol in the presence of an acidic catalyst), a fluorene novolac resin (those obtained by reacting a fluorenone compound with a 9,9-bis(hydroxyaryl)fluorene in the presence of an acidic catalyst), a phenol aralkyl resin, a cresol aralkyl resin, a naphthol aralkyl resin, and a biphenyl aralkyl resin (those obtained by reacting a bishalogenomethyl compound as represented by $Ar_4$—$(CH_2Y)_2$ (wherein $Ar_4$ represents a phenyl group and Y represents a halogen atom. The same applies in this paragraph.) with a phenolic compound with an acidic catalyst or with no catalyst, those obtained by reacting a bis(alkoxymethyl) compound as represented by $Ar_4$—$(CH_2OR)_2$ (wherein R represents an alkyl group) with a phenolic compound in the presence of an acidic catalyst, or those obtained by reacting a bis(hydroxymethyl) compound as represented by $Ar_4$—$(CH_2OH)_2$ with a phenolic compound in the presence of an acidic catalyst, or those obtained by polycondensing an aromatic aldehyde compound, an aralkyl compound, and a phenolic compound, using a publicly known method), a phenol-modified xylene formaldehyde resin (those obtained by reacting a xylene formaldehyde resin with a phenolic compound in the presence of an acidic catalyst, using a publicly known method), a modified naphthalene formaldehyde resin (those obtained by reacting a naphthalene formaldehyde resin with a hydroxy-substituted aromatic compound in the presence of an acidic catalyst, using a publicly known method), a phenol-modified dicyclopentadiene resin, and a phenolic resin having a polynaphthylene ether structure (those obtained by subjecting a polyvalent hydroxynaphthalene compound having two or more phenolic hydroxy groups in one molecule to dehydration condensation in the presence of a basic catalyst, using a publicly known method) by a method similar to the above, and a prepolymer thereof. One of these cyanate compounds can be used, or two or more thereof can be appropriately mixed and used.

The method for producing these cyanate compounds is not particularly limited, and a publicly known method can be used. Examples of such a production method include acquisition or synthesis of a hydroxy group containing compound having a desired skeleton and cyanation of that compound by modifying the hydroxy group by a publicly known method. Examples of the approach for the cyanation of hydroxy groups include, for example, the approach described in Ian Hamerton, Chemistry and Technology of Cyanate Ester Resins, Blackie Academic & Professional.

The cured product using these cyanate compounds has a property of being excellent in glass transition temperature, low thermal expansion properties, plating adhesiveness, and the like.

In the resin composition, the content of the cyanate compound is preferably 0.5 to 85 parts by mass based on 100 parts by mass of the total of the bismaleimide compound (A), the cyanate compound (B2), and the photo initiator (C).

(Benzoxazine Compound)

For the resin composition, a benzoxazine compound (B3) (also referred to as component (B3)) can be used. The benzoxazine compound (B3) will be described below.

As the benzoxazine compound (B3), those publicly known in general can be used as long as it has an oxazine ring as a basic skeleton. The benzoxazine compound also includes compounds having a polycyclic oxazine skeleton, such as naphthoxazine compounds.

The benzoxazine compound (B3) is preferably a compound represented by the formula (20) or a compound represented by the formula (21) because good photocurability can be obtained.

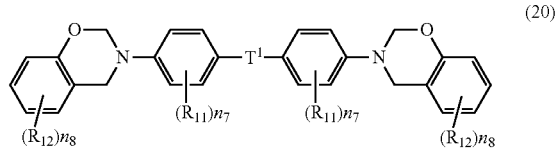

In the formula (20), each $R_{11}$ independently represents a hydrogen atom, an aryl group, an aralkyl group, an alkenyl group, an alkyl group, or a cycloalkyl group. Each $n_7$ independently represents an integer of 1 to 4. Each $R_{12}$ independently represents a hydrogen atom, an aryl group, an aralkyl group, an alkenyl group, an alkyl group, or a cycloalkyl group. Each $n_8$ independently represents an integer of 1 to 4. $T^1$ represents an alkylene group, a group represented by the formula (22), a group represented by the formula "—$SO_2$—", a group represented by the formula "—CO—", an oxygen atom, or a single bond.

For both $R_{11}$ and $R_{12}$, the aryl group is preferably an aryl group having 6 to 18 carbon atoms. Examples of such an aryl group include a phenyl group, a naphthyl group, an indenyl group, a biphenyl group, and an anthryl group. Among them, a phenyl group is more preferable. These aryl groups may have one or more, preferably one to three lower alkyl groups having 1 to 4 carbon atoms. Examples of the aryl group having such a lower alkyl group can include a tolyl group, a xylyl group, and a methylnaphthyl group.

For both $R_{11}$ and $R_{12}$, the aralkyl group is preferably a benzyl group or a phenethyl group. These may have one or more, preferably one to three lower alkyl groups having 1 to 4 carbon atoms on the phenyl group thereof.

For both $R_{11}$ and $R_{12}$, examples of the alkenyl group include a vinyl group, a (meth)allyl group, a propenyl group, a butenyl group, and a hexenyl group. Among the above, a vinyl group, an allyl group and a propenyl group are preferable, and an allyl group is more preferable.

For both $R_{11}$ and $R_{12}$, the alkyl group is preferably an alkyl group having 1 to 20 carbon atoms, more preferably an alkyl group having 1 to 10 carbon atoms. The alkyl group having 3 or more carbon atoms may be linear or branched. Examples thereof include a methyl group, an ethyl group, a n-propyl group, an isopropyl group, a n-butyl group, an isobutyl group, a sec-butyl group, a t-butyl group, a n-pentyl group, a neopentyl group, a n-hexyl group, a thexyl group, a n-heptyl group, a n-octyl group, a n-ethylhexyl group, a n-nonyl group and a n-decyl group.

For both $R_{11}$ and $R_{12}$, examples of the cycloalkyl group include a cyclopentyl group, a cyclohexyl group, and a cycloheptyl group. Preferred is a cyclohexyl group.

The alkylene group in $T^1$ is preferably a linear or branched alkylene group. Examples of the linear alkylene group include a methylene group, an ethylene group, a propylene group, a butylene group, a pentylene group, a hexylene group, a heptylene group, an octylene group, a nonylene group, a decanylene group, a trimethylene group, a tetramethylene group, a pentamethylene group, and a hexamethylene group. Examples of the branched alkylene group include alkylmethylene groups such as —$C(CH_3)_2$—, —CH($CH_3$)—, —CH($CH_2CH_3$)—, —C($CH_3$)($CH_2CH_3$)—, —C($CH_3$)($CH_2CH_2CH_3$)—, and —C($CH_2CH_3$)$_2$—; and alkylethylene groups such as —CH($CH_3$)$CH_2$—, —CH($CH_3$)CH($CH_3$)—, —C($CH_3$)$_2$$CH_2$—, —CH($CH_2CH_3$)$CH_2$—, and —C($CH_2CH_3$)$_2$—$CH_2$—.

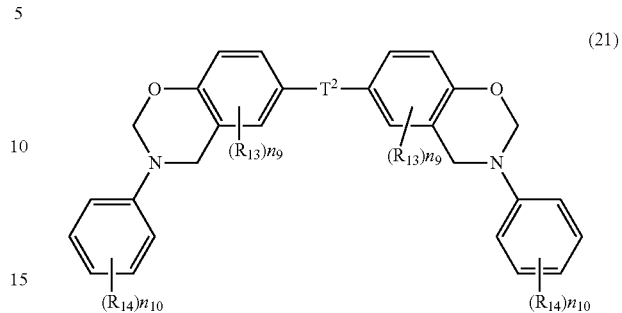

In the formula (21), each $R_{13}$ independently represents a hydrogen atom, an aryl group, an aralkyl group, an alkenyl group, an alkyl group, or a cycloalkyl group. Each $n_9$ independently represents an integer of 1 to 3. Each $R_{14}$ independently represents a hydrogen atom, an aryl group, an aralkyl group, an alkenyl group, an alkyl group, or a cycloalkyl group. Each $n_{10}$ independently represents an integer of 1 to 5. $T^2$ represents an alkylene group, a group represented by the formula (22), a group represented by the formula "—$SO_2$—", a group represented by the formula "—CO—", an oxygen atom, or a single bond.

For both $R_{13}$ and $R_{14}$, the aryl group, aralkyl group, alkenyl group, alkyl group and cycloalkyl group are as defined above. The alkylene group in $T^2$ is as defined above.

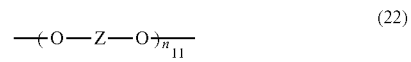

In the formula (22), Z represents an alkylene group or a hydrocarbon group having an aromatic ring and having 6 or more and 30 or less carbon atoms. $n_{11}$ represents an integer of 0 or more and 5 or less. $n_{11}$ is preferably an integer of 1 or more and 3 or less, and more preferably 1 or 2.

The alkylene group in Z is as defined above.

Examples of the hydrocarbon group having 6 or more and 30 or less carbon atoms and an aromatic ring include divalent groups obtained by removing two hydrogen atoms from a nucleus of an aromatic compound such as benzene, biphenyl, naphthalene, anthracene, fluorene, phenanthrene, indacene, terphenyl, acenaphthylene, and phenalene.

As the benzoxazine compound (B3), commercial products can also be used. Examples thereof include P-d-based benzoxazine (3,3'-(methylene-1,4-diphenylene)bis(3,4-dihydro-2H-1,3-benzoxazine), compound represented by the formula (20), manufactured by Shikoku Chemicals Corporation), F-a-based benzoxazine (2,2-bis(3,4-dihydro-2H-3-phenyl-1,3-benzoxazinyl)methane, compound represented by the formula (21), manufactured by Shikoku Chemicals Corporation), bisphenol A-based benzoxazine BA-BXZ (product name, Konishi Chemical Inc Co., Ltd.), bisphenol F-based benzoxazine BF-BXZ (product name, Konishi Chemical Inc Co., Ltd.), bisphenol S-based benzoxazine BS-BXZ (product name, Konishi Chemical Inc Co., Ltd.), and phenolphthalein-based benzoxazine.

One of these benzoxazine compounds (B3) can be used, or two or more thereof can be appropriately mixed and used.

The benzoxazine compound is preferably a compound represented by the formula (20) or a compound represented by the formula (21), and more preferably 3,3'-(methylene-1,4-diphenylene)bis(3,4-dihydro-2H-1,3-benzoxazine) because the benzoxazine compound has good heat resistance.

In the resin composition, the content of the benzoxazine compound is preferably 0.5 to 85 parts by mass based on 100 parts by mass of the total of the bismaleimide compound (A), the benzoxazine compound (B3) and the photo initiator (C).

(Epoxy Resin)

For the resin composition, an epoxy resin (B4) (also referred to as component (B4)) can be used. The epoxy resin (B4) will be described below.

As the epoxy resin (B4), those publicly known in general can be used. Examples thereof include, for example, a bisphenol A-based epoxy resin, a bisphenol E-based epoxy resin, a bisphenol F-based epoxy resin, a bisphenol S-based epoxy resin, a bisphenol A novolac-based epoxy resin, a biphenyl-based epoxy resin, a phenol novolac-based epoxy resin, a cresol novolac-based epoxy resin, a xylene novolac-based epoxy resin, a polyfunctional phenol-based epoxy resin, a naphthalene-based epoxy resin, a naphthalene skeleton modified novolac-based epoxy resin, a naphthylene ether-based epoxy resin, a phenol aralkyl-based epoxy resin, an anthracene-based epoxy resin, a trifunctional phenol-based epoxy resin, a tetrafunctional phenol-based epoxy resin, triglycidyl isocyanurate, a glycidyl ester-based epoxy resin, an alicyclic epoxy resin, a dicyclopentadiene novolac-based epoxy resin, a biphenyl novolac-based epoxy resin, a phenol aralkyl novolac-based epoxy resin, a naphthol aralkyl novolac-based epoxy resin, an aralkyl novolac-based epoxy resin, a naphthol aralkyl-based epoxy resin, a dicyclopentadiene-based epoxy resin, a polyol-based epoxy resin, a phosphorus containing epoxy resin, a glycidyl amine, a compound obtained by epoxidizing a double bond of butadiene and the like, a compound obtained by the reaction between a hydroxyl group containing silicone resin and epichlorohydrin, and a halide thereof. One of these epoxy resins can be used, or two or more thereof can be appropriately mixed and used.

As the epoxy resin, commercial products can also be used. Examples of the commercial products include an epoxy resin represented by the formula (23) (NC-3000 FH (product name) manufactured by Nippon Kayaku Co., Ltd., $n_{12}$ is about 4 in the formula (23)), and a naphthalene-based epoxy resin represented by the formula (24) (HP-4710 (product name) manufactured by DIC CORPORATION).

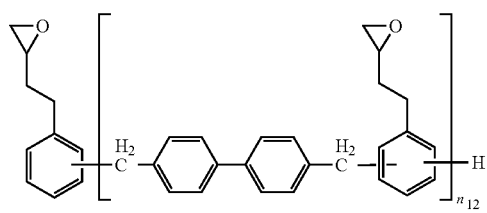

(23)

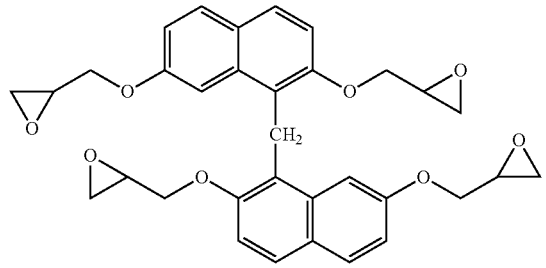

(24)

One of these epoxy resins can be used, or two or more thereof can be appropriately mixed and used.

The epoxy resin is preferably an epoxy resin represented by the formula (23) or an epoxy resin represented by the formula (24), and more preferably an epoxy resin represented by the formula (23) because the cured product has excellent heat resistance.

In the resin composition, the content of the epoxy resin is preferably 0.5 to 85 parts by mass based on 100 parts by mass of the total of the bismaleimide compound (A), the epoxy resin (B4) and the photo initiator (C).

(Carbodiimide Compound)

For the resin composition, a carbodiimide compound (B5) (also referred to as component (B5)) can be used. The carbodiimide compound (B5) will be described below.

As the carbodiimide compound (B5), those publicly known in general can be used as long as it has at least one or more carbodiimide groups in the molecule. Examples thereof include polycarbodiimides such as N,N'-dicyclohexyl carbodiimide, dicyclohexyl carbodiimide, diisopropyl carbodiimide, dimethyl carbodiimide, diisobutyl carbodiimide, dioctyl carbodiimide, t-butyl isopropyl carbodiimide, diphenyl carbodiimide, di-t-butyl carbodiimide, di-β-naphthyl carbodiimide, N,N'-di-2,6-diisopropylphenyl carbodiimide, 2,6,2',6'-tetraisopropyldiphenyl carbodiimide, cyclic carbodiimide, Carbodilite (registered trademark) B-01 (manufactured by Nisshinbo Chemical Inc.), and Stabaxol (registered trademark: manufactured by Rhein Chemie).

One of these carbodiimide compounds (B5) can be used, or two or more thereof can be appropriately mixed and used.

The carbodiimide compound is preferably Carbodilite (registered trademark) B-01, V-03, V05 (all product names, manufactured by Nisshinbo Chemical Inc.), and more preferably Carbodilite (registered trademark) B-01 (product name: manufactured by Nisshinbo Chemical Inc.) because of its good heat resistance and good adhesion to the conductor layer when used as an insulating layer of a printed wiring board.

In the resin composition, the content of the carbodiimide compound is preferably 0.5 to 85 parts by mass based on 100 parts by mass of the resin solid content in the resin composition.

(Compound Having Ethylenically Unsaturated Group)

For the resin composition, a compound (B6) (also referred to as component (B6)) having an ethylenically unsaturated group can be used. The compound (B6) having an ethylenically unsaturated group will be described below.

As the compound (B6) having an ethylenically unsaturated group, those publicly known in general can be used as long as it is a compound having one or more ethylenically unsaturated groups in one molecule. Examples thereof include compounds having a (meth)acryloyl group, a vinyl group, and the like.

Examples of the compound having a (meth)acryloyl group include methyl (meth)acrylate, ethyl (meth)acrylate, butyl (meth)acrylate, lauryl (meth)acrylate, polyethylene glycol (meth)acrylate, polyethylene glycol (meth)acrylate monomethylether, phenylethyl (meth)acrylate, isobornyl (meth)acrylate, cyclohexyl (meth)acrylate, benzyl (meth)acrylate, tetrahydrofurfuryl (meth)acrylate, butanediol di(meth)acrylate, hexanediol di(meth)acrylate, neopentyl glycol di(meth)acrylate, nonanediol di(meth)acrylate, glycol di(meth)acrylate, diethylene di(meth)acrylate, polyethylene glycol di(meth)acrylate, tris(meth)acryloyloxyethyl isocyanurate, polypropylene glycol di(meth)acrylate, adipic acid epoxy di(meth)acrylate, bisphenol ethyleneoxide di(meth)acrylate, hydrogenated bisphenol ethyleneoxide (meth)acrylate, bisphenol di(meth)acrylate, ε-caprolactone-modified hydroxypivalic acid neopentylglycol di(meth)acrylate, ε-caprolactone-modified dipentaerythritol hexa(meth)acrylate, ε-caprolactone-modified dipentaerythritol poly(meth)acrylate, dipentaerythritol poly(meth)acrylate, trimethylolpropane tri(meth)acrylate, triethylolpropane tri(meth)acrylate, and ethyleneoxide adducts thereof; pentaerythritol tri(meth)acrylate and ethyleneoxide adducts thereof; and pentaerythritol tetra(meth)acrylate, dipentaerythritol hexa(meth)acrylate and ethyleneoxide adducts thereof.

Further, other examples thereof also include urethane (meth)acrylates having both a (meth)acryloyl group and a urethane bond in the same molecule; polyester (meth)acrylates having both a (meth)acryloyl group and an ester bond in the same molecule; epoxy (meth)acrylates derived from an epoxy resin and having both a (meth)acryloyl group; and reactive oligomers in which these bonds are used in combination.

Examples of the urethane (meth)acrylate include a reaction product of a hydroxyl group-containing (meth)acrylate with a polyisocyanate and other alcohols used if required. Examples thereof include urethane (meth)acrylates obtained by reacting hydroxyalkyl (meth)acrylates such as hydroxyethyl (meth)acrylate, hydroxypropyl (meth)acrylate, and hydroxybutyl (meth)acrylate; glycerin (meth)acrylates such as glycerin mono(meth)acrylate and glycerin di(meth)acrylate; sugar alcohol (meth)acrylates such as pentaerythritol di(meth)acrylate, pentaerythritol tri(meth)acrylate, dipentaerythritol penta(meth)acrylate, and dipentaerythritol hexa(meth)acrylate; and polyisocyanates such as toluene diisocyanate, hexamethylene diisocyanate, trimethylhexamethylene diisocyanate, isophorone diisocyanate, norbornene diisocyanate, xylene diisocyanate, hydrogenated xylene diisocyanate, dicyclohexane methylene diisocyanate, and isocyanurates and biurets thereof.

Examples of the polyester (meth)acrylates include monofunctional (poly)ester (meth) acrylates such as caprolactone-modified 2-hydroxyethyl (meth)acrylate, ethylene oxide-and/or propylene oxide-modified phthalic acid (meth)acrylate, ethylene oxide-modified succinic acid (meth)acrylate, and caprolactone-modified tetrahydrofurfuryl (meth)acrylate; di(poly)ester (meth)acrylates such as hydroxypivalic acid ester neopentyl glycol di(meth)acrylate, caprolactone-modified hydroxypivalic acid ester neopentyl glycol di(meth)acrylate, and epichlorohydrin-modified phthalic acid di(meth)acrylate; and mono-, di-, or tri(meth)acrylates of triols obtained by adding one or more moles of cyclic lactone compounds such as ε-caprolactone, γ-butyrolactone, and δ-valerolactone to one mole of trimethylolpropane or glycerin.

Examples thereof include mono-, di-, tri- or tetra(meth)acrylates of triols obtained by adding one mol or more of cyclic lactone compounds such as ε-caprolactone, γ-butyrolactone and δ-valerolactone to one mol of pentaerythritol, dimethylolpropane, trimethylolpropane, or tetramethylolpropane; and mono(meth)acrylates or poly(meth)acrylates of triols or polyhydric alcohols such as triols, tetraols, pentaols or hexaols of poly(meth)acrylates obtained by adding one mol or more of cyclic lactone compounds such as ε-caprolactone, γ-butyrolactone and δ-valerolactone to one mole of dipentaerythritol.

Examples thereof further include (meth)acrylates of polyester polyols obtained by reacting a diol component such as (poly)ethylene glycol, (poly)propylene glycol, (poly)tetramethylene glycol, (poly)butylene glycol, 3-methyl-1,5-pentanediol, and hexanediol and a polybasic acid such as maleic acid, fumaric acid, succinic acid, adipic acid, phthalic acid, isophthalic acid, hexahydrophthalic acid, tetrahydrophthalic acid, dimer acid, sebacic acid, azelaic acid, and 5-sodium sulfoisophthalic acid and anhydrides thereof; and polyfunctional (poly)ester(meth)acrylates such as (meth)acrylates of cyclic lactone-modified polyester diols containing a diol component, a polybasic acid and an anhydride thereof and ε-caprolactone, γ-butyrolactone and δ-valerolactone.

The epoxy (meth)acrylate is a carboxylate compound of a compound having an epoxy group and (meth)acrylic acid. Examples thereof include phenol novolac-based epoxy (meth)acrylate, cresol novolac-based epoxy (meth)acrylate, trishydroxyphenylmethane-based epoxy (meth)acrylate, dicyclopentadienephenol-based epoxy (meth)acrylate, bisphenol A-based epoxy (meth)acrylate, bisphenol F-based epoxy (meth)acrylate, biphenol-based epoxy (meth)acrylate, bisphenol A novolac-based epoxy (meth)acrylate, naphthalene skeleton-containing epoxy (meth)acrylate, glyoxal-based epoxy (meth)acrylate, heterocyclic epoxy (meth)acrylate, and acid anhydride-modified epoxy acrylates thereof.

Examples of the compound having a vinyl group include a vinyl ether such as ethyl vinyl ether, propyl vinyl ether, hydroxyethyl vinyl ether, and ethylene glycol divinyl ether; and a styrene such as styrene, methylstyrene, ethylstyrene, and divinylbenzene. Examples of other vinyl compounds include triallyl isocyanurate, trimethallyl isocyanurate, and bisallylnadiimide.

As the compound having an ethylenically unsaturated group, commercial products can also be used. Examples thereof include KAYARADZCA (registered trademark)-601H (product name, manufactured by Nippon Kayaku Co., Ltd.) represented by the formula (25), propylene glycol monomethyl ether acetate of TrisP-PA epoxy acrylate compound (KAYARAD (registered trademark) ZCR-6007H (product name), manufactured by Nippon Kayaku Co., Ltd.), a mixture containing a compound represented by the following formula (26) and any one or more compounds of the formulas (27) to (30), KAYARAD (registered trademark) ZCR-6001H (product name), KAYARAD (registered trademark) ZCR-6002H (product name), and KAYARAD (registered trademark) ZCR-6006H (product name).

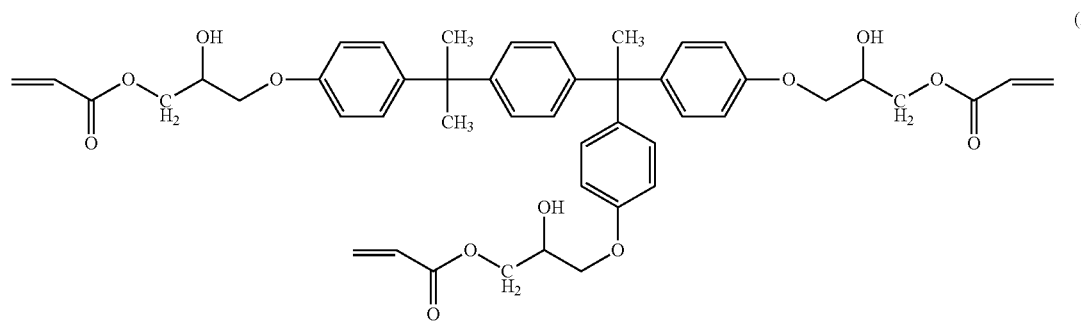
(25)
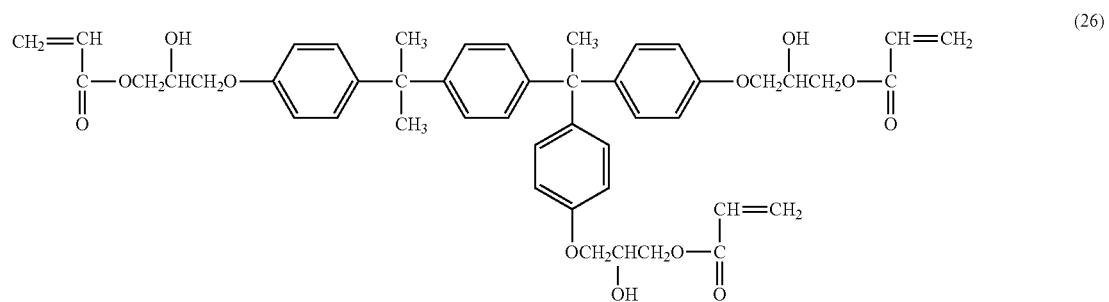
(26)
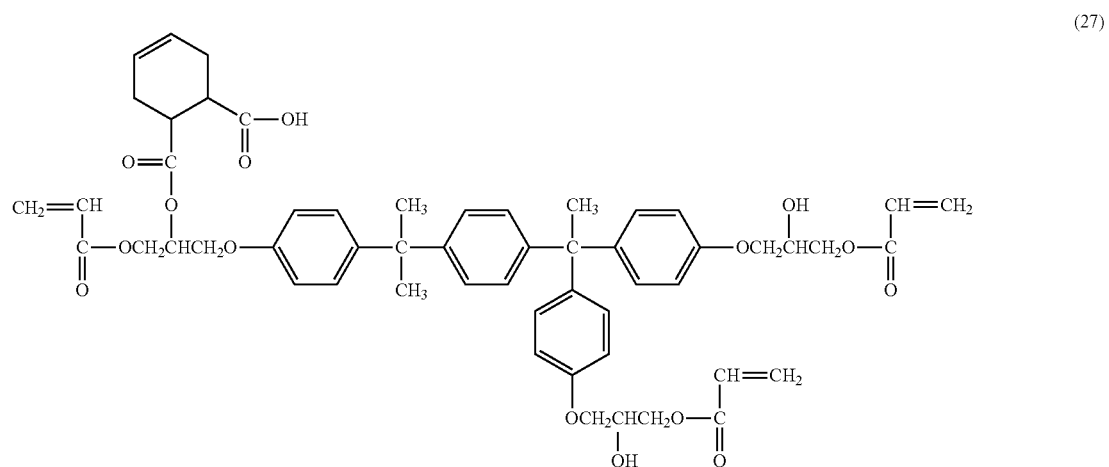
(27)
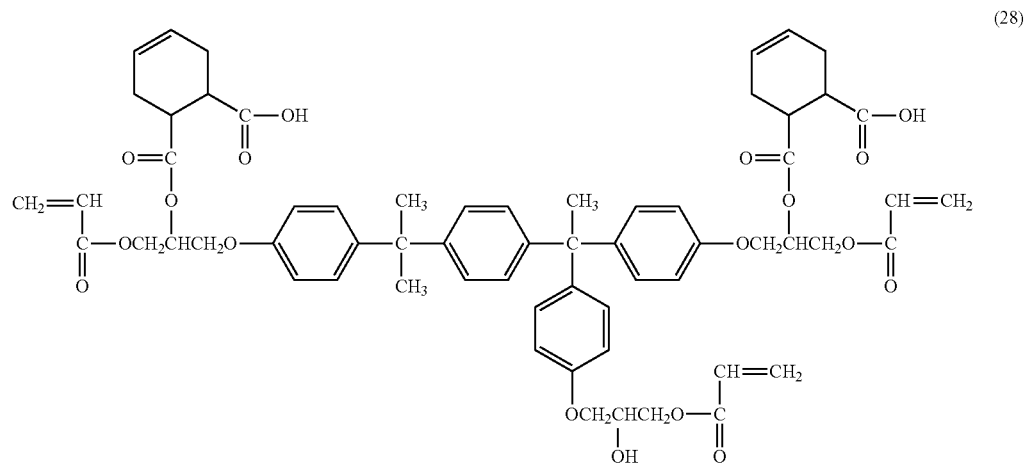
(28)

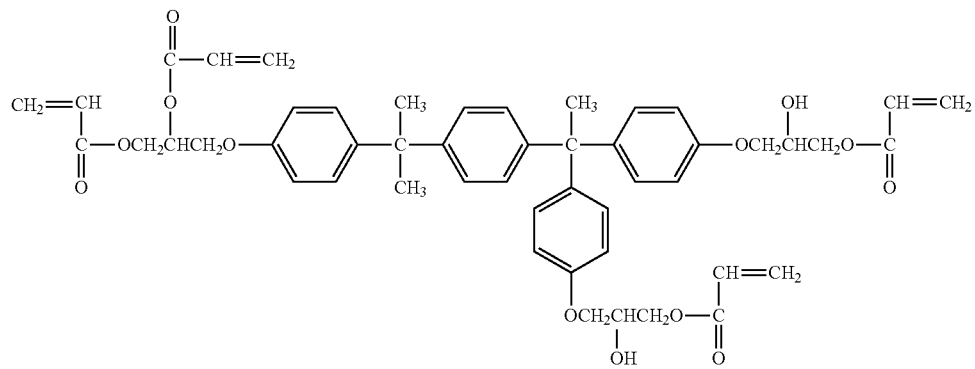

(29)

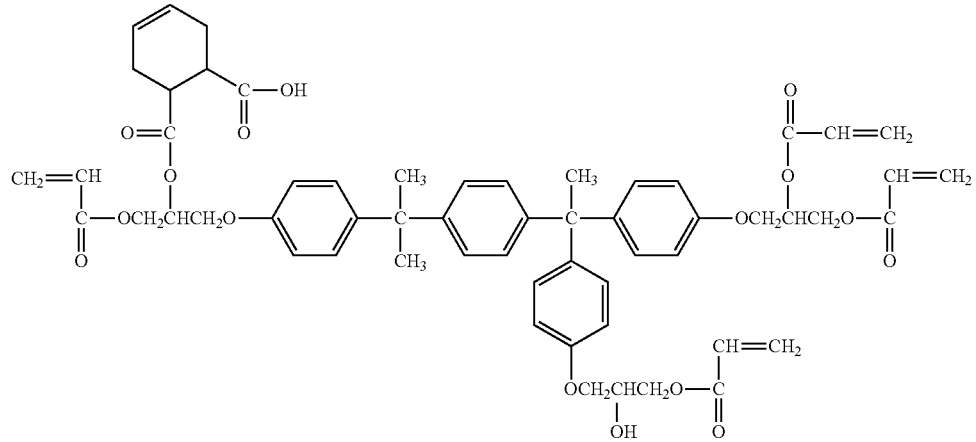

(30)

One of these compounds (B6) having an ethylenically unsaturated group can be used, or two or more thereof can be appropriately mixed and used.

The compound having an ethylenically unsaturated group is preferably propylene glycol monomethyl ether acetate of TrisP-PA epoxy acrylate compound because it has good thermal stability.

In the resin composition, the content of the compound having an ethylenically unsaturated group is preferably 0.5 to 85 parts by mass based on 100 parts by mass of the total of the bismaleimide compound (A), the benzoxazine compound (B3) and the photo initiator (C).

[Photo Initiator (C)]

The resin composition according to the present embodiment contains the photo initiator (C) (also referred to as component (C)). As the photo initiator (C), those publicly known in fields where photo initiators are generally used for photocurable resin compositions. The photo initiator (C) is used together with the bismaleimide compound (A) and the resin or compound (B) for photocuring using various active energy rays.

Examples of the photo initiator (C) include radical type photo initiators such as benzoins such as benzoin, benzoin methyl ether, benzoin ethyl ether, benzoin isopropyl ether and benzoin isobutyl ether; organic peroxides exemplified by benzoyl peroxide, lauroyl peroxide, acetyl peroxide, parachlorobenzoyl peroxide, di-tert-butyl-di-perphthalate and the like; phosphine oxides such as 2,4,6-trimethylbenzoyl-diphenyl-phosphine oxide, and bis(2,4,6-trimethylbenzoyl)-phenylphosphine oxide; acetophenones such as acetophenone, 2,2-diethoxy-2-phenylacetophenone, 2,2-diethoxy-2-phenylacetophenone, 1,1-dichloroacetophenone, 2-hydroxy-2-methyl-phenylpropan-1-one, diethoxyacetophenone, 1-hydroxycyclohexylphenylketone, 2-methyl-1-[4-(methylthio)phenyl]-2-morpholino-propan-1-one and 2-benzyl-2-dimethylamino-1-(4-morpholinophenyl)-butanone-1; anthraquinones such as 2-ethylanthraquinone, 2-t-butylanthraquinone, 2-chloroanthraquinone and 2-amylanthraquinone; thioxanthones such as 2,4-diethylthioxanthone, 2-isopropylthioxanthone and 2-chlorothioxanthone; ketals such as acetophenone dimethyl ketal and benzyl dimethyl ketal; benzophenones such as benzophenone, 4-benzoyl-4'-methyldiphenyl sulfide and 4,4'-bismethylaminobenzophenone; and oxime esters such as 1,2-octanedione, 1-[4-(phenylthio)-, 2-(O-benzoyloxime)] and 1-[9-ethyl-6-(2-methylbenzoyl)-9H-carbazol-3-yl]-ethanone-1-(O-acetyloxime);

diazonium salts of Lewis acid such as p-methoxyphenyldiazonium fluorophosphonate and N,N-diethylaminophenyldiazonium hexafluorophosphonate; iodonium salts of Lewis acid such as diphenyliodonium hexafluorophosphonate and diphenyliodonium hexafluoroantimonate; sulfonium salts of Lewis acid such as triphenylsulfonium hexafluorophosphonate and triphenylsulfonium hexafluoroantimonate; phosphonium salts of Lewis acid such as triphenylphosphonium hexafluoroantimonate; additional halides; triazine-based initiators; borate-based initiators; and cationic photo initiators such as additional photoacid generating agents.

As the photo initiator (C), commercial products can also be used. Examples of the commercial product include Omnirad (registered trademark) 369 (product name) manufactured by IGM Resins, Omnirad (registered trademark) 819 (product name) manufactured by IGM Resins, Omnirad (registered trademark) 819DW (product name) manufactured by IGM Resins, Omnirad (registered trademark) 907 (product name) manufactured by IGM Resins, Omnirad (registered trademark) TPO (product name) manufactured by IGM Resins, Omnirad (registered trademark) TPO-L (product name) manufactured by IGM Resins, Omnirad (registered trademark) 784 (product name) manufactured by IGM Resins, Irgacure (registered trademark) OXE01 (product name) manufactured by BASF Japan Ltd., Irgacure (registered trademark) OXE02 (product name) manufactured by BASF Japan Ltd., Irgacure (registered trademark) OXE03 (product name) manufactured by BASF Japan Ltd., and Irgacure (registered trademark) OXE04 (product name) manufactured by BASF Japan Ltd.

One of these photo initiators (C) can be used, or two or more thereof can be appropriately mixed and used.

In the present embodiment, the photo initiator (C) has an absorbance of preferably 0.1 or more when a chloroform solution containing the photo initiator (C) at 0.01% by mass is prepared, and the absorbance of the chloroform solution containing the photo initiator (C) at 0.01% by mass is measured using an active energy ray including a wavelength of 365 nm (i-line). In this case, the photo initiator (C) exhibits very excellent light absorption. In addition, the photo initiator (C) has an absorbance of preferably 0.1 or more when the absorbance of a chloroform solution containing the photo initiator (C) at 0.01% by mass is measured using an active energy ray including a wavelength of 405 nm (h-line). Even in this case, very excellent light absorption is exhibited. When such a photo initiator (C) is used, for example, upon producing a printed wiring board having a highly dense and highly detailed wiring formation (pattern) using the direct imaging method, the photo radical reaction of the maleimide occurs efficiently even when an active energy ray including a wavelength of 405 nm (h-line) is used. The absorbance at a wavelength of 365 nm (i-line) is more preferably 0.15 or more because a resin composition that is superior in photocurability can be obtained. The absorbance at a wavelength of 405 nm (h-line) is more preferably 0.15 or more because a resin composition that is superior in photocurability can be obtained. The upper limit of each of the absorbance at a wavelength of 365 nm (i-line) and the absorbance at a wavelength of 405 nm (h-line) is, for example, 99.9 or less.

As such a photo initiator (C), a compound represented by the formula (2) is preferable.

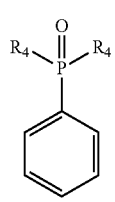

(2)

In the formula (2), each $R_4$ independently represents a substituent represented by the formula (3) or a phenyl group.

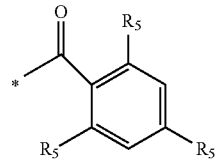

(3)

In the formula (3), each $R_5$ independently represent a hydrogen atom or a methyl group. In the formula (3), -* indicates a bonding hand to a phosphorus atom (P) in the formula (2).

As for the compound represented by the formula (2), when a chloroform solution containing this compound at 0.01% by mass is prepared and the absorbance of this chloroform solution is measured using an active energy ray including a wavelength of 365 nm (i-line), the absorbance is 0.1 or more, exhibiting very excellent absorption of the light with a wavelength of 365 nm (i-line). Therefore, this compound suitably generates radicals in response to the light with a wavelength of 365 nm (i-line). The absorbance is preferably 0.15 or more. The upper limit value is, for example, 5.0 or less, and may be 10.0 or less.

As for the compound represented by the formula (2), when a chloroform solution containing this compound at 0.01% by mass is prepared and the absorbance of this chloroform solution is measured using an active energy ray including a wavelength of 405 nm (h-line), the absorbance is 0.1 or more, exhibiting very excellent absorption of the light with a wavelength of 405 nm (h-line). Therefore, this compound suitably generates radicals in response to the light with a wavelength of 405 nm (h-line). Therefore, this compound suitably generates radicals in response to the light with a wavelength of 405 nm (h-line). The absorbance is preferably 0.15 or more. The upper limit value is, for example, 5.0 or less, and may be 10.0 or less.

In the formula (2), each $R_4$ independently represents a substituent represented by the formula (3) or a phenyl group. It is preferable that one or more among $R_4$s be the substituents represented by the formula (3).

In the formula (3), each $R_5$ independently represent a hydrogen atom or a methyl group. It is preferable that one or more among $R_5$s be methyl groups, and it is more preferable that all should be methyl groups.

Examples of the compound represented by the formula (2) include phosphine oxides such as 2,4,6-trimethylbenzoyl-diphenyl-phosphine oxide and bis(2,4,6-trimethylbenzoyl)-phenylphosphine oxide. Among the above, bis(2,4,6-trimethylbenzoyl)-phenylphosphine oxide is preferable because it has excellent light transmittivity. One of these compounds can be used, or two or more thereof can be appropriately mixed and used.

Acylphosphine oxides exhibit very excellent absorption of an active energy ray including a wavelength of 405 nm (h-line) and can suitably radical polymerize the bismaleimide compound (A) having a transmittance of, for example, 5% or more at a wavelength of 405 nm (h-line). Therefore, it becomes possible to suitably produce a resin composition which have excellent photocurability and can provide a cured product having excellent heat resistance, thermal stability, and insulation reliability in a well-balanced manner especially when used for a multilayer printed wiring board, and a resin sheet; and a multilayer printed wiring board and a semiconductor device obtained using these.

In the resin composition, the content of the photo initiator (C) is preferably 0.1 to 10 parts by mass, more preferably 1 to 8 parts by mass, and still more preferably 2 to 7 parts by mass based on 100 parts by mass of the total of the bismaleimide compound (A), the resin or compound (B), and the photo initiator (C), from the viewpoint of sufficiently advancing the photocuring of the bismaleimide compound (A) and the resin or compound (B) to obtain more excellent heat resistance and thermal stability.

[Filler]

In the resin composition of the present embodiment, a filler (D) (also referred to as component (D)) can also be contained for improving a variety of characteristics such as a coating property and heat resistance. The filler (D) is preferably one that has an insulation property and does not inhibit transmittivity for various active energy rays used for photocuring, and more preferably one that does not inhibit transmittivity for active energy rays including a wavelength of 365 nm (i-line) and/or a wavelength of 405 nm (h-line).

Examples of the filler (D) include, for example, silica (for example, natural silica, fused silica, amorphous silica and hollow silica), an aluminum compound (for example, boehmite, aluminum hydroxide, alumina and aluminum nitride), a boron compound (for example, boron nitride), a magnesium compound (for example, magnesium oxide and magnesium hydroxide), a calcium compound (for example, calcium carbonate), a molybdenum compound (for example, molybdenum oxide and zinc molybdate), a barium compound (for example, barium sulfate and barium silicate), talc (for example, natural talc and calcined talc), mica, glass (for example, short fibrous glass, spherical glass, fine powder glass, E glass, T glass and D glass), silicone powder, a fluororesin-based filler, a urethane resin-based filler, a (meth)acrylic resin-based filler, a polyethylene-based filler, a styrene-butadiene rubber, and a silicone rubber. One of these fillers (D) can be used, or two or more thereof can be appropriately mixed and used.

Among the above, silica, boehmite, barium sulfate, silicone powder, a fluororesin-based filler, a urethane resin-based filler, a (meth)acrylic resin-based filler, a polyethylene-based filler, a styrene-butadiene rubber and a silicone rubber are preferable.

These fillers (D) may be surface-treated with a silane coupling agent, which will be mentioned later, or the like.

From the viewpoint of improving the heat resistance of the cured product and also obtaining a good coating property, silica is preferable and fused silica is more preferable. Specific examples of the silica include SFP-130MC (product name) manufactured by Denka Company Limited, and SC2050-MB (product name), SC1050-MLE (product name), YA010C-MFN (product name), and YA050C-MJA (product name) manufactured by Admatechs Company Limited.

The particle diameter of the filler (D), is normally 0.005 to 10 μm, and is preferably 0.01 to 1.0 μm from the viewpoint of ultraviolet light transmittivity of the resin composition.

In the resin composition of the present embodiment, the content of the filler (D) is preferably 300 parts by mass or less, more preferably 200 parts by mass or less, and still more preferably 100 parts by mass or less based on 100 parts by mass of the total of the bismaleimide compound (A), the resin or compound (B) and the photo initiator (C) from the viewpoint of improving the light transmittivity of the resin composition and the heat resistance of the cured product. The upper limit value may be 30 parts by mass or less, 20 parts by mass or less, or 10 parts by mass or less. When the filler (D) is contained, the lower limit value of its content is normally 1 part by mass based on 100 parts by mass of the total of the bismaleimide compound (A), the resin or compound (B) and the photo initiator (C) from the viewpoint of obtaining effects of improving a variety of characteristics such as a coating property and heat resistance.

[Silane Coupling Agent and Wetting and Dispersing Agent]

In the resin composition of the present embodiment, a silane coupling agent and/or a wetting and dispersing agent can also be used in combination in order to improve the dispersibility of the filler, and the adhesive strength between the polymers and/or the resins and the filler.

The silane coupling agent is not limited as long as it is a silane coupling agent generally used for surface treatment of inorganic matters. Specific examples thereof include aminosilane-based compounds such as 3-aminopropyltrimethoxysilane, γ-aminopropyltriethoxysilane, 3-aminopropyldimethoxymethylsilane, 3-aminopropyldiethoxymethylsilane, N-β-(aminoethyl)-γ-aminopropyltrimethoxysilane, N-(2-aminoethyl)-3-aminopropyltriethoxysilane, N-(2-aminoethyl)-3-aminopropyldimethoxymethylsilane, N-(2-aminoethyl)-3-aminopropyldiethoxymethylsilane, N-phenyl-3-aminopropyltrimethoxysilane, N-phenyl-3-aminopropyltriethoxysilane, [3-(6-aminohexylamino)propyl]trimethoxysilane and [3-(N,N-dimethylamino)propyl]trimethoxysilane; epoxysilane-based compounds such as γ-glycidoxypropyltrimethoxysilane, 3-glycidoxypropyltriethoxysilane, 3-glycidoxypropyldimethoxymethylsilane, 3-glycidoxypropyldiethoxymethylsilane, 2-(3,4-epoxycyclohexyl)ethyltrimethoxysilane and [8-(glycidyloxy)-n-octyl]trimethoxysilane; vinylsilane-based compounds such as vinyltris(2-methoxyethoxy)silane, vinyltrimethoxysilane, vinyltriethoxysilane, dimethoxymethylvinylsilane, diethoxymethylvinylsilane, trimethoxy(7-octen-1-yl)silane and trimethoxy(4-vinylphenyl)silane; methacrylic silane-based compounds such as 3-methacryloxypropyltrimethoxysilane, 3-methacryloxypropyltriethoxysilane, 3-methacryloxypropyldimethoxymethylsilane and 3-methacryloxypropyldiethoxymethylsilane; (meth)acrylic silane-based compounds such as γ-acryloxypropyltrimethoxysilane and 3-acryloxypropyltriethoxysilane; isocyanate silane-based compounds such as 3-isocyanatepropyltrimethoxysilane and 3-isocyanatepropyltriethoxysilane; isocyanurate silane-based compounds such as tris-(trimethoxysilylpropyl)isocyanurate; mercaptosilane-based compounds such as 3-mercaptopropyltrimethoxysilane and 3-mercaptopropyldimethoxymethylsilane; ureidosilane-based compounds such as 3-ureidopropyltriethoxysilane; styrylsilane-based compounds such as p-styryltrimethoxysilane; cationic silane-based compounds such as N-β-(N-vinylbenzylaminoethyl)-γ-aminopropyltrimethoxysilane hydrochlorides; acid anhydride-based compounds such as [3-(trimethoxysilyl)propyl]succinic anhydride; phenylsilane-based compounds such as phenyltrimethoxysilane, phenyltriethoxysilane, dimethoxymethylphenylsilane, diethoxymethylphenylsilane and p-tolyltrimethoxysilane; and arylsilane-based compounds such as trimethoxy(1-naphthyl)silane. One of these silane coupling agents can be used, or two or more thereof can be appropriately mixed and used.

In the resin composition of the present embodiment, the content of the silane coupling agent is normally 0.1 to 10 parts by mass based on 100 parts by mass of the total of the bismaleimide compound (A), the resin or compound (B) and the photo initiator (C).

The wetting and dispersing agent is not particularly limited as long as it is a dispersion stabilizer used for a paint. Specific examples of the wetting and dispersing agent include a wetting and dispersing agent such as DISPERBYK (registered trademark)-110 (product name), 111 (product name), 118 (product name), 180 (product name), and 161 (product name), BYK (registered trademark)-W996 (product name), W9010 (product name), and W903 (product name) manufactured by BYK Japan KK. One of these wetting and dispersing agents can be used, or two or more thereof can be appropriately mixed and used.

In the resin composition of the present embodiment, the content of the wetting and dispersing agent is normally 0.1 to 10 parts by mass based on 100 parts by mass of the total of the bismaleimide compound (A), the resin or compound (B) and the photo initiator (C).

[Curing Accelerator]

The resin composition of the present embodiment preferably contains a curing accelerator if required in order to appropriately adjust the cure rate. As the curing accelerator, those generally used as a curing accelerator for cyanate compounds or the like can be used. Examples of the curing accelerator include, for example, an organometallic salt such as zinc octylate, zinc naphthenate, cobalt naphthenate, copper naphthenate, iron acetylacetonate, nickel octylate, and manganese octylate; a phenolic compound such as phenol, xylenol, cresol, resorcin, catechol, octyl phenol, and nonyl phenol; an alcohol such as 1-butanol and 2-ethylhexanol; an imidazole such as 2-methylimidazole, 2-ethyl-4-methylimidazole, 2-phenylimidazole, 1-cyanoethyl-2-phenylimidazole, 1-cyanoethyl-2-ethyl-4-methylimidazole, 2-phenyl-4,5-dihydroxymethylimidazole, and 2-phenyl-4-methyl-5-hydroxymethylimidazole, and a derivative of these imidazoles such as an adduct with a carboxylic acid or anhydride thereof; an amine such as dicyandiamide, benzyl dimethylamine, and 4-methyl-N,N-dimethylbenzylamine; a phosphorus compound such as a phosphine-based compound, a phosphine oxide-based compound, a phosphonium salt-based compound, and diphosphine-based compound; an epoxy-imidazole adduct-based compound; a peroxide such as benzoyl peroxide, p-chlorobenzoyl peroxide, di-t-butyl peroxide, diisopropyl peroxycarbonate, and di-2-ethylhexyl peroxycarbonate; and an azo compound such as 2,2'-azobisisobutyronitrile (hereinafter, also referred to as "AIBN"). One of these curing accelerator can be used, or two or more thereof can be appropriately mixed and used.

In the resin composition of the present embodiment, the content of the curing accelerator is normally 0.1 to 20 parts by mass based on 100 parts by mass of the total of the bismaleimide compound (A), the resin or compound (B) and the photo initiator (C).

[Organic Solvent]

The resin composition of the present embodiment may contain an organic solvent if required. When an organic solvent is used, the viscosity can be adjusted during the preparation of the resin composition. The type of the organic solvent is not particularly limited as long as it is capable of dissolving a part of or all of the resin in the resin composition. Examples of the organic solvent include ketones such as acetone, methyl ethyl ketone, and methyl isobutyl ketone; alicyclic ketones such as cyclopentanone, and cyclohexanone; cellosolve-based solvents such as propylene glycol monomethyl ether and propylene glycol monomethyl ether acetate; ester-based solvents such as ethyl lactate, methyl acetate, ethyl acetate, butyl acetate, isoamyl acetate, ethyl lactate, methyl methoxypropionate, methyl hydroxyisobutyrate, and γ-butyrolactone; polar solvents such as amides such as dimethylacetamide and dimethylformamide; and nonpolar solvents such as aromatic hydrocarbons such as toluene and xylene.

One of these organic solvents can be used, or two or more thereof can be appropriately mixed and used.

[Additional Component]

In the resin composition of the present embodiment, a variety of polymer compounds such as thermosetting resins, thermoplastic resins and oligomers thereof, and elastomers, which have not been mentioned before; flame retardant compounds, which have not been mentioned before; additive agents and the like can also be used in combination to the extent that the characteristics of the present embodiment are not impaired. These are not particularly limited as long as they are those generally used. Examples of the flame retardant compound include, for example, a nitrogen containing compound such as melamine and benzoguanamine, an oxazine ring containing compound, and a phosphorus compound such as a phosphate compound, an aromatic fused phosphate ester, and a halogen containing fused phosphate ester. Examples of the additive agent include, for example, an ultraviolet absorbing agent, an antioxidant, a fluorescent brightening agent, a photosensitizer, a dye, a pigment, a thickening agent, a lubricant, a defoaming agent, a surface conditioner, a brightening agent, a polymerization inhibitor and a thermal curing accelerator. One of these components can be used, or two or more thereof can be appropriately mixed and used.

In the resin composition of the present embodiment, the content of the additional component is normally 0.1 to 10 parts by mass based on 100 parts by mass of the total of the bismaleimide compound (A), the resin or compound (B) and the photo initiator (C).

[Method for Producing Resin Composition]

The resin composition of the present embodiment is prepared by appropriately mixing the bismaleimide compound (A), the resin or compound (B), and the photo initiator (C), and if required, the filler (D), the additional resin, the additional compound, the additive agent, and the like. The resin composition can be suitably used as a varnish upon fabricating a resin sheet of the present embodiment, which will be mentioned later. The organic solvent used for preparation of varnish is not particularly limited, and specific examples thereof are as described above.

Examples of the method for producing the resin composition include a method in which each of the components described above is sequentially compounded in a solvent and stirred sufficiently. The resin composition is excellent in photocurability, and a cured product obtained from the resin composition is excellent in heat resistance, thermal stability, and insulation reliability.

Upon producing the resin composition, publicly known treatment (stirring, mixing, and kneading treatment and the like) for uniformly dissolving or dispersing each component can be carried out, if required. Specifically, by using a stirring tank equipped with a stirrer having an appropriate stirring capacity to carry out the stirring and dispersion treatment, the dispersibility of each component in the resin composition can be improved. The stirring, mixing and kneading treatment can be appropriately carried out by using a publicly known apparatus such as a stirring apparatus intended for dispersion such as an ultrasonic homogenizer; an apparatus intended for mixing such as a three roll mill, a ball mill, a bead mill or a sand mill; or a revolution or rotation mixing apparatus. In addition, upon preparing the resin composition, an organic solvent can be used if required. The type of the organic solvent is not particularly limited as long as it is capable of dissolving the resin in the resin composition, and specific examples thereof are as described above.

The resin composition can be suitably used as a varnish upon fabricating a resin sheet of the present embodiment, which will be mentioned later. The varnish can be obtained by a publicly known method. For example, the varnish can be obtained by adding 10 to 900 parts by mass of an organic solvent to 100 parts by mass of components other than the organic solvent in the resin composition of the present embodiment and carrying out the publicly known mixing treatment (stirring, kneading treatment or the like).

[Application]

The resin composition can be preferably used in applications where a resin composition having insulation reliability is required. For example, the resin composition of the present embodiment can be used for applications including a photosensitive film, a photosensitive film with a support, a prepreg, a resin sheet, a circuit substrate (applications for a laminate, applications for a multilayer printed wiring board, and the like), a solder resist, an underfill material, a die bonding material, a semiconductor sealing material, a hole filling resin, and a component embedding resin. Among the above, the resin composition can be suitably used for an insulating layer of a multilayer printed wiring board or for a solder resist because it is excellent in photocurability, heat resistance, and thermal stability.

[Cured Product]

The cured product is formed by curing the resin composition of the present embodiment. The cured product can be obtained by, for example, melting the resin composition or dissolving the resin composition in a solvent, then pouring the resin composition into a mold, and curing the resin composition with light under normal conditions. It is preferable to cure the resin composition in a light wavelength range of 100 to 500 nm where curing is efficiently promoted by a photo initiator or the like.

[Resin Sheet]

A resin sheet of the present embodiment is a resin sheet with a support containing: a support; and a resin layer disposed on one surface or both surfaces of the support, wherein the resin layer contains the resin composition. The resin sheet can be produced by applying the resin composition onto the support and drying it. The resin layer in the resin sheet has excellent heat resistance, thermal stability, and insulation reliability.

As the support, those publicly known can be used, and a resin film is preferable. Examples of the resin film include a polyimide film, a polyamide film, a polyester film, a polyethylene terephthalate (PET) film, a polybutylene terephthalate (PBT) film, a polypropylene (PP) film, a polyethylene (PE) film, a polyethylene naphthalate film, a polyvinyl alcohol film and a triacetyl acetate film. Among the above, PET film is preferable.

Preferably, the surface of the resin film is coated with a release agent in order to facilitate release from the resin layer. The thickness of the resin film is preferably in the range of 5 to 100 μm and more preferably in the range of 10 to 50 μm. When the thickness is less than 5 μm, the support tends to be easily torn at the time when the support is released before development, and when the thickness is greater than 100 μm, the resolution upon being exposed through the support tends to be reduced.

In addition, in order to reduce light scattering during exposure, it is preferable that the resin film should have excellent transparency.

Furthermore, in the resin sheet of the present embodiment, the resin layer thereof may be protected with a protective film.

By protecting the resin layer side with a protective film, adhesion of dust and the like to the surface of the resin layer and scratches can be prevented. As the protective film, a film composed of a material similar to the resin film can be used. The thickness of the protective film is preferably in the range of 1 to 50 μm and more preferably in the range of 5 to 40 μm. If the thickness is less than 1 μm, the handleability of the protective film tends to be reduced, and if the thickness is greater than 50 μm, the inexpensiveness tends to be poor. Note that it is preferable for the protective film to have a smaller adhesive force between the resin layer and the protective film than the adhesive force between the resin layer and the support.

Examples of the method for producing the resin sheet of the present embodiment include a method in which the resin composition of the present embodiment is applied to a support such as PET film and the organic solvent is removed by drying to produce the resin sheet.

The application method can be carried out by a publicly known method using, for example, a roll coater, a comma coater, a gravure coater, a die coater, a bar coater, a lip coater, a knife coater, a squeeze coater, or the like. The drying can be carried out by, for example, a method of heating in a dryer at 60 to 200° C. for 1 to 60 minutes.

The amount of organic solvent remaining in the resin layer is preferably less than 5% by mass based on the total mass of the resin layer from the viewpoint of preventing diffusion of the organic solvent in the subsequent steps. It is preferable that the thickness of the resin layer should be 1 to 50 μm from the viewpoint of improving handleability.

The resin sheet can be preferably used for production of insulating layers of multilayer printed wiring boards.

[Multilayer Printed Wiring Board]

The multilayer printed wiring board of the present embodiment contains an insulating layer; and a conductor layer formed on one surface or both surfaces of the insulating layer, wherein the insulating layer contains the resin composition. The insulating layer can also be obtained by, for example, laminating one or more of the resin sheets and curing them. The numbers of lamination in the insulating layer and the conductor layer is not particularly limited, and the numbers of lamination can be appropriately set according to an intended application. The order of the insulating layer and the conductor layer is not particularly limited. The conductor layer may be a metal foil used for various printed wiring board materials, and examples thereof include metal foils of copper, aluminum and the like. Examples of the copper metal foil include a rolled copper foil and an electrolytic copper foil. The thickness of the conductor layer is normally 1 to 100 μm. In particular, it can be produced by the following method.

(Lamination Step)

In a lamination step, the resin layer side of the resin sheet is laminated to one surface or both surfaces of a circuit substrate using a vacuum laminator. Examples of the circuit substrate include, for example, a glass epoxy substrate, a metal substrate, a ceramic substrate, a silicon substrate, a semiconductor sealing resin substrate, a polyester substrate, a polyimide substrate, a BT resin substrate, and a thermosetting polyphenylene ether substrate. Note that a circuit substrate refers to a substrate in which a patterned conductor layer (circuit) is formed on one surface or both surfaces of a substrate. Also, in a multilayer printed wiring board formed by alternately laminating a conductor layer and an insulating layer, a substrate in which one surface or both surfaces of the outermost layer of the multilayer printed wiring board are patterned conductor layers (circuits) is also included in the circuit substrate. Note that the insulating layer laminated on the multilayer printed wiring board may be an insulating layer obtained by laminating and curing one or more resin sheets of the present embodiment, or an insulating layer obtained by laminating one or more resin sheets of the present embodiment and one or more publicly known resin sheets different from the resin sheet of the present embodiment. Note that the mode in which the resin sheets of the present embodiment and the publicly known resin sheets different from the resin sheet of the present embodiment are laminated is not particularly limited. The surface of the conductor layer may be subjected to blackening treatment and/or roughening treatment by copper etching or the like in advance. In the lamination step, when the resin sheet has a protective film, the protective film is peeled off and removed. Then, the resin sheet and the circuit substrate are preheated if required, and while pressurizing and heating the resin layer of the resin sheet, it is crimped to the circuit substrate. In the present embodiment, a method of laminating the resin layer of the resin sheet to the circuit substrate under reduced pressure using a vacuum lamination method is suitably used.

As conditions of the lamination step, for example, it is preferable to perform the lamination under reduced pressure with a crimping temperature (lamination temperature) of 50 to 140° C., crimping pressure of 1 to 15 kgf/cm$^2$, crimping time of 5 to 300 seconds, and air pressure of 20 mmHg or less. Also, the lamination step may be in a batch type or in a continuous type using a roll. The vacuum lamination method can be carried out using a commercially available vacuum laminator. Examples of the commercially available vacuum laminator include, for example, Two-Stage Build-Up Laminator (product name) manufactured by Nikko-Materials Co., Ltd.

(Exposure Step)

In the exposure step, after providing the resin layer on the circuit substrate by the lamination step, a predetermined portion of the resin layer is irradiated with an active energy ray as a light source to cure the resin layer in the irradiated part.

The irradiation may be performed through a mask pattern or may be performed by using the direct imaging method in which the irradiation is directly applied. Examples of the active energy ray include, for example, ultraviolet rays, visible rays of light, electron beam, and X-rays. The wavelength of the active energy ray is, for example, in the range of 200 to 600 nm. When an ultraviolet ray is used, the irradiation amount thereof is approximately 10 to 1000 mJ/cm$^2$. Upon producing a printed wiring board having a highly dense and highly detailed wiring formation (pattern) using the stepper exposure method, it is preferable to use, for example, an active energy ray including a wavelength of 365 nm (i-line) as an active energy ray. When an active energy ray including a wavelength of 365 nm (i-line) is used, the irradiation amount is approximately 10 to 10,000 mJ/cm$^2$. Upon producing a printed wiring board having a highly dense and highly detailed wiring formation (pattern) using the direct imaging method, it is preferable to use, for example, an active energy ray including a wavelength of 405 nm (h-line) as an active energy ray. When an active energy ray including a wavelength of 405 nm (h-line) is used, the irradiation amount is approximately 10 to 10,000 mJ/cm$^2$.

There are two exposure methods for passing through the mask pattern: the contact exposure method, in which the mask pattern is adhered to the multilayer printed wiring board, and the non-contact exposure method, in which parallel light rays are used to perform the exposure without adhering the mask pattern to the multilayer printed wiring board, but either method may be used. Also, when a support is present on the resin layer, it may be exposed from the top of the support, or it may be exposed after the support is removed.

(Development Step)

In the present embodiment, a development step may be included if required.

That is, when a support is not present on the resin layer, a portion which is not photocured in wet development (unexposed portion) is removed after the exposure step, and development is performed, whereby an insulating layer pattern can be formed. When a support is present on the resin layer, the support is removed after the exposure step, and thereafter a portion which is not photocured in wet development (unexposed portion) is removed, and development is performed, whereby an insulating layer pattern can be formed.

In the case of wet development, the developing solution is not particularly limited as long as unexposed portion is selectively eluted. For example, organic solvents such as cyclohexanone, cyclopentanone, and γ-butyrolactone; alkaline developing solutions such as an aqueous tetramethylammonium hydroxide solution, an aqueous sodium carbonate solution, an aqueous potassium carbonate solution, an aqueous sodium hydroxide solution and an aqueous potassium hydroxide solution are used. One of these developing solutions can be used, or two or more thereof can be appropriately mixed and used.

As the development method, for example, a known method such as dipping, paddling, spraying, shaking immersion, blushing and scraping can be carried out. In pattern formation, these development methods can be used in combination if necessary. As the development method, use of a high-pressure spray is suitable because the resolution is further improved. When the spraying method is employed, the spray pressure is preferably 0.02 to 0.5 MPa.

(Postbaking Step)

A postbaking step is carried out after the exposure step or after the development step, thereby forming an insulating layer (cured product). Examples of the postbaking step include an ultraviolet irradiation step with a high pressure mercury lamp and a heating step using a clean oven, and these steps may be used in combination as well. When irradiating with ultraviolet ray, the irradiation amount thereof can be adjusted if required, and for example, the irradiation can be carried out at an irradiation amount of approximately 50 to 10,000 mJ/cm$^2$. Also, the conditions of heating can be appropriately selected if required, but they are preferably selected from the range of 20 to 180 minutes at 150 to 220° C., and more preferably from the range of 30 to 150 minutes at 160 to 200° C.

(Conductor Layer Formation Step)

After forming the insulating layer (cured product), a conductor layer is formed on the surface of the insulating layer by dry plating. For the dry plating, a publicly known method such as a vapor deposition method, a sputtering method, and an ion plating method can be used. In the vapor deposition method (vacuum deposition method), for example, a metallic film can be formed on the insulating layer by placing the multilayer printed wiring board in a vacuum container and heating and evaporating the metal. In the sputtering method as well, for example, the multilayer printed wiring board is placed in a vacuum container, an inert gas such as argon is introduced, a direct current voltage is applied, the ionized inert gas is brought into collision with the target metal, and the knocked-out metal can be used to form a metallic film on the insulating layer.

Next, a conductor layer is formed by nonelectrolytic plating or electroplating. As a method of subsequent pattern formation, for example, a subtractive method, a semi-additive method, or the like can be used.

[Semiconductor Device]

A semiconductor device of the present embodiment contains the resin composition. In particular, it can be produced by the following method. A semiconductor device can be produced by mounting a semiconductor chip at the conduction points on the multilayer printed wiring board. Here, the conduction points refer to the points in the multilayer printed wiring board where electrical signals are conveyed, and the locations thereof may be on the surface or at embedded points. In addition, the semiconductor chip are not particularly limited as long as they are electrical circuit elements made of semiconductors.

The method for mounting the semiconductor chip upon producing the semiconductor device is not particularly limited as long as the semiconductor chip effectively functions. Specific examples thereof include a wire bonding mounting method, a flip chip mounting method, a mounting method with a bumpless build-up layer (BBUL), a mounting method with an anisotropic conductive film (ACF), and a mounting method with a non-conductive film (NCF).

Alternatively, the semiconductor device can be produced by forming an insulating layer containing the resin composition on a semiconductor chip or a substrate on which the semiconductor chip is mounted. The shape of the substrate on which semiconductor chip is mounted may be wafer-like or panel-like. After the formation, the semiconductor device can be produced using the same method as the multilayer printed wiring board.

EXAMPLES

The present embodiment will be more specifically described below using Examples and Comparative Examples. The present embodiment is not limited in any way by the following Example.

Synthetic Example 1

0.47 mol (in terms of OH group) of α-naphthol aralkyl-based phenolic resins (SN495V (product name) manufactured by Nippon Steel Chemical Co., Ltd., OH group equivalents: 236 g/eq., including naphthol aralkyls with the number n of repeating units of 1 to 5) was dissolved in chloroform 500 mL, and 0.7 mol of triethyl amine was added thereto (Solution 1).

While maintaining the temperature at −10° C., solution 1 was added dropwise over 1.5 hours to, 300 g of a solution of 0.93 mol of cyanogen chloride in chloroform and after the dropwise addition was completed, the mixture was stirred for 30 minutes.

Then, a mixed solution of 0.1 mol of triethylamine and 30 g of chloroform was added dropwise into the reactor and stirred for 30 minutes to complete the reaction. After the hydrochloride salt of triethylamine as by-product was filtered off from the reaction solution, the resulting filtrate was washed with 500 mL of 0.1 N hydrochloric acid before washing with 500 mL of water 4 times. This was dried over sodium sulphate, evaporated at 75° C., and further degassed under reduced pressure at 90° C. to obtain brown solid α-naphthol aralkyl-based cyanate resin (SNCN, formula (31), including those having $n_{13}$ of 1 to 4). When the obtained α-naphthol aralkyl-based cyanate resin was analyzed by infrared absorption spectrum, absorption of cyanate group around 2264 cm$^{-1}$ was confirmed.

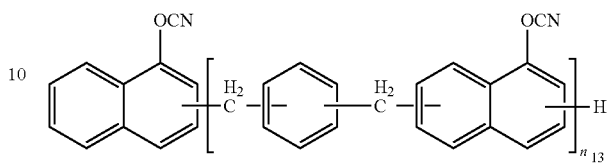

(31)

[Evaluation of Raw Material]
[Transmittance and Absorbance]

As the bismaleimide compound (A), MIZ-001 (product name, mass average molecular weight (Mw): 3000) manufactured by Nippon Kayaku Co., Ltd. was used to prepare a chloroform solution containing this MIZ-001 (product name) at 1% by mass, and measurement of the transmittance at each of a wavelength of 365 nm and a wavelength of 405 nm was carried out using an UV-vis measuring apparatus (Hitachi Spectrophotometer U-4100 (product name) manufactured by Hitachi High-Technologies Corporation).

As the resin or compound, the α-naphthol aralkyl-based cyanate resin (SNCN, cyanate resin) obtained in Synthesis Example 1 was used to prepare an N-methylpyrrolidone solution containing this cyanate resin at 1% by mass, and measurement of the transmittance at each of a wavelength of 365 nm and a wavelength of 405 was carried out using an UV-vis measuring apparatus (Hitachi Spectrophotometer U-4100 (product name) manufactured by Hitachi High-Technologies Corporation).

In the same manner, P-d-based benzoxazine (3,3'-(methylene-1,4-diphenylene)bis(3,4-dihydro-2H-1,3-benzoxazine), benzoxazine compound, manufactured by Shikoku Chemicals Corporation), propylene glycol monomethyl ether acetate of TrisP-PA epoxy acrylate compound (KAYARAD (registered trademark) ZCR-6007H (product name), compound having an ethylenically unsaturated group, manufactured by Nippon Kayaku Co., Ltd.), epoxy resin (NC-3000 FH (product name), manufactured by Nippon Kayaku Co., Ltd.), and carbodiimide compound (Carbodilite B-01 (product name), manufactured by Nisshinbo Chemical Inc.) were used as the resin or compound (B), and measurement of the transmittance at each of a wavelength of 365 nm and a wavelength of 405 nm was carried out.

As the photo initiator (C), bis(2,4,6-trimethylbenzoyl)-phenylphosphine oxide (Omnirad (registered trademark) 819 (product name) manufactured by IGM Resins) was used to prepare a chloroform solution containing this Omnirad (registered trademark) 819 (product name) at 0.01% by mass, and measurement of the absorbance at each of a wavelength of 365 nm and a wavelength of 405 nm was carried out using an UV-vis measuring apparatus (Hitachi Spectrophotometer U-4100 (product name) manufactured by Hitachi High-Technologies Corporation).

In the same manner, 2-benzyl-2-dimethylamino-1-(4-morpholinophenyl)-butanone-1 (Omnirad (registered trademark) 369 (product name) manufactured by IGM Resins) and 2-methyl-1-[4-(methylthio)phenyl]-2-morpholinopropan-1-one (Omnirad (registered trademark) 907 (product name) manufactured by IGM Resins) were used as the photo initiators, and measurement of the absorbance at each of a wavelength of 365 nm and a wavelength of 405 nm was carried out.

The results are shown in Table 1.

TABLE 1

|  |  | 365 nm Transmittance [%] | 405 nm Transmittance [%] | 365 nm Absorbance [—] | 405 nm Absorbance [—] |
|---|---|---|---|---|---|
| Bismaleimide compound (A) | MIZ-001 | 19 | 88 | — | — |
| Resin or compound (B) | cyanate resin | 33 | 55 | — | — |
|  | benzoxazine compound | 0 | 36 | — | — |
|  | compound having ethylenically unsaturated group | 97 | 99 | — | — |
|  | epoxy resin | 91 | 98 | — | — |
|  | carbodiimide compound | 89 | 94 | — | — |
| Photo initiator (C) | Omnirad819 | — | — | 0.32 | 0.18 |
|  | Omnirad369 | — | — | 0.48 | 0.04 |
|  | Omnirad907 | — | — | 0.10 | 0.01 |

Example 1

[Fabrication of Resin Composition and Resin Sheet]

47.5 parts by mass of MIZ-001 (product name) as the bismaleimide compound (A), 47.5 parts by mass of the α-naphthol aralkyl-based cyanate resin (SNCN) obtained in Synthesis Example 1, which is a cyanate compound (B2), as the resin or compound (B), 5 parts by mass of bis(2,4,6-trimethylbenzoyl)-phenylphosphine oxide (Omnirad (registered trademark) 819 (product name)) as the photo initiator (C), and 5 parts by mass of 2-ethyl-4-methylimidazole (2E4MZ, manufactured by Shikoku Chemicals Corporation) as a curing accelerator were mixed, diluted with 150 parts by mass of methyl ethyl ketone (manufactured by Idemitsu Kosan Co., Ltd.), and then stirred with an ultrasonic homogenizer, thereby obtaining a varnish (solution of the resin composition).

This varnish is applied onto a PET film with a thickness of 38 μm (Unipeel (registered trademark) TR1-38 (product name) manufactured by UNITIKA LTD.) using an auto film applicator (PI-1210 (product name) manufactured by TESTER SANGYO CO., LTD.) and heated and dried at 90° C. for 5 minutes, thereby obtaining a resin sheet having the PET film as a support and a resin layer with a thickness of 30 μm.

(Fabrication of Resin for Evaluation)

The resin surfaces of the obtained resin sheets were pasted together, and a vacuum laminator (manufactured by Nikko-Materials Co., Ltd.) was used to perform vacuum drawing (5.0 hPa or less) for 30 seconds, followed by lamination molding at a pressure of 10 kgf/cm² and a temperature of 70° C. for 30 seconds. Furthermore, by performing lamination molding at a pressure of 7 kgf/cm² and a temperature of 70° C. for 60 seconds, a resin for evaluation with supports on both surfaces was obtained.

Example 2

A resin sheet was obtained in the same manner as in Example 1, except that 47.5 parts by mass of P-d-based benzoxazine (3,3'-(methylene-1,4-diphenylene)bis(3,4-dihydro-2H-1,3-benzoxazine), manufactured by Shikoku Chemicals Corporation), which is a benzoxazine compound (B3), was used as the resin or compound (B) instead of 47.5 parts by mass of α-naphthol aralkyl-based cyanate resin (SNCN), and 2-ethyl-4-methylimidazole (2E4MZ), which is a curing accelerator, was not compounded. Using this resin sheet, a resin for evaluation was obtained in the same manner as in Example 1.

Example 3

A resin sheet was obtained in the same manner as in Example 1 except that 47.5 parts by mass of propylene glycol monomethyl ether acetate of TrisP-PA epoxy acrylate compound (KAYARAD (registered trademark) ZCR-6007H (product name), manufactured by Nippon Kayaku Co., Ltd.), which is the compound (B6) having an ethylenically unsaturated group, as the resin or compound (B) instead of 47.5 parts by mass of α-naphthol aralkyl-based cyanate resin (SNCN) and 5 parts by mass of 2,2'-azobis (isobutyronitrile) (AIBN, manufactured by Fujifilm Wako Pure Chemical Corporation) as the curing accelerator instead of 5 parts by mass of 2-ethyl-4-methylimidazole (2E4MZ) were used. Using this resin sheet, a resin for evaluation was obtained in the same manner as in Example 1.

Example 4

A resin sheet was obtained in the same manner as in Example 1 by using 94 parts by mass of MIZ-001 (product name) as the bismaleimide compound (A), 1 part by mass of epoxy resin represented by the formula (23) (NC-3000 FH (product name), manufactured by Nippon Kayaku Co., Ltd.), which is the epoxy resin (B4), as the resin or compound (B), and 5 parts by mass of 2,4,6-trimethylbenzoyl-diphenyl-phosphine oxide (Omnirad (registered trademark) 819 (product name)) as the photo initiator (C). Using this resin sheet, a resin for evaluation was obtained in the same manner as in Example 1.

Example 5

A resin sheet was obtained in the same manner as in Example 1, except that 47.5 parts by mass of Carbodilite B-01 (product name, manufactured by Nisshinbo Chemical Inc.), which is a carbodiimide compound (B5), was used as the resin or compound (B) instead of 47.5 parts by mass of α-naphthol aralkyl-based cyanate resin (SNCN), and 2-ethyl-4-methylimidazole (2E4MZ), which is a curing accelerator, was not compounded. Using this resin sheet, a resin for evaluation was obtained in the same manner as in Example 1.

Example 6

A resin sheet was obtained in the same manner as in Example 1 except that as the photo initiator (C), 5 parts by mass of 2-benzyl-2-dimethylamino-1-(4-morpholinophenyl)-butanone-1 (Omnirad (registered trademark) 369 (product name)) was used instead of 5 parts by mass of bis(2,4, 6-trimethylbenzoyl)-phenylphosphine oxide (Omnirad (registered trademark) 819 (product name)). Using this resin sheet, a resin for evaluation was obtained in the same manner as in Example 1.

Example 7

A resin sheet was obtained in the same manner as in Example 1 except that as the photo initiator (C), 5 parts by mass of 2-methyl-1-[4-(methylthio)phenyl]-2-morpholino-propan-1-one (Omnirad (registered trademark) 907 (product name)) was used instead of 5 parts by mass of bis(2,4,6-trimethylbenzoyl)-phenylphosphine oxide (Omnirad (registered trademark) 819 (product name)). Using this resin sheet, a resin for evaluation was obtained in the same manner as in Example 1.

Example 8

A resin sheet was obtained in the same manner as in Example 1 except that 45.5 parts by mass of MIZ-001 (product name) was changed to 94.9 parts by mass as the bismaleimide compound (A), and 47.5 parts by mass of α-naphthol aralkyl-based cyanate resin (SNCN) was changed to 0.1 parts by mass as the resin or compound. Using this resin sheet, a resin for evaluation was obtained in the same manner as in Example 1.

Example 9

A resin sheet was obtained in the same manner as in Example 1 except that 45.5 parts by mass of MIZ-001 (product name) was changed to 94 parts by mass as the bismaleimide compound (A), and 47.5 parts by mass of α-naphthol aralkyl-based cyanate resin (SNCN) was changed to 1 part by mass as the resin or compound (B). Using this resin sheet, a resin for evaluation was obtained in the same manner as in Example 1.

Example 10

A resin sheet was obtained in the same manner as in Example 1 except that 45.5 parts by mass of MIZ-001 (product name) was changed to 85.5 parts by mass as the bismaleimide compound (A), and 47.5 parts by mass of α-naphthol aralkyl-based cyanate resin (SNCN) was changed to 9.5 parts by mass as the resin or compound (B). Using this resin sheet, a resin for evaluation was obtained in the same manner as in Example 1.

Example 11

A resin sheet was obtained in the same manner as in Example 1 except that 45.5 parts by mass of MIZ-001 (product name) was changed to 19 parts by mass as the bismaleimide compound (A), and 47.5 parts by mass of α-naphthol aralkyl-based cyanate resin (SNCN) was changed to 76 parts by mass as the resin or compound (B). Using this resin sheet, a resin for evaluation was obtained in the same manner as in Example 1.

Comparative Example 1

95 parts by mass of MIZ-001 (product name) as the bismaleimide compound and 5 parts by mass of bis(2,4,6-trimethylbenzoyl)-phenylphosphine oxide (Omnirad (registered trademark) 819 (product name)) as the photo initiator were mixed, diluted with 150 parts by mass of methyl ethyl ketone (manufactured by Idemitsu Kosan Co., Ltd.), and then stirred with an ultrasonic homogenizer, thereby obtaining a varnish (solution of the resin composition).

This varnish is applied onto a PET film with a thickness of 38 μm (Unipeel (registered trademark) TR1-38 (product name) manufactured by UNITIKA LTD.) using an auto film applicator (PI-1210 (product name) manufactured by TESTER SANGYO CO., LTD.) and heated and dried at 90° C. for 5 minutes, thereby obtaining a resin sheet having the PET film as a support and a resin layer with a thickness of 30 μm.

Using this resin sheet, a resin for evaluation was obtained in the same manner as in Example 1.

Comparative Example 2

50 parts by mass of MIZ-001 (product name) as the bismaleimide compound and 50 parts by mass of the α-naphthol aralkyl-based cyanate resin (SNCN) obtained in Synthesis Example 1, which is a cyanate compound, as the resin or compound were mixed, diluted with 150 parts by mass of methyl ethyl ketone (manufactured by Idemitsu Kosan Co., Ltd.), and then stirred with an ultrasonic homogenizer, thereby obtaining a varnish (solution of the resin composition).

This varnish is applied onto a PET film with a thickness of 38 μm (Unipeel (registered trademark) TR1-38 (product name) manufactured by UNITIKA LTD.) using an auto film applicator (PI-1210 (product name) manufactured by TESTER SANGYO CO., LTD.) and heated and dried at 90° C. for 5 minutes, thereby obtaining a resin sheet having the PET film as a support and a resin layer with a thickness of 30 μm.

Using this resin sheet, a resin for evaluation was obtained in the same manner as in Example 1.

Comparative Example 3

95 parts by mass of the α-naphthol aralkyl-based cyanate resin (SNCN) obtained in Synthesis Example 1, which is a cyanate compound, as the resin or compound, 5 parts by mass of bis(2,4,6-trimethylbenzoyl)-phenylphosphine oxide (Omnirad (registered trademark) 819 (product name)) as the photo initiator, and 5 parts by mass of 2-ethyl-4-methylimidazole (2E4MZ, manufactured by Shikoku Chemicals Corporation) as a curing accelerator were mixed, diluted with 150 parts by mass of methyl ethyl ketone (manufactured by Idemitsu Kosan Co., Ltd.), and then stirred with an ultrasonic homogenizer, thereby obtaining a varnish (solution of the resin composition).

This varnish is applied onto a PET film with a thickness of 38 μm (Unipeel (registered trademark) TR1-38 (product name) manufactured by UNITIKA LTD.) using an auto film applicator (PI-1210 (product name) manufactured by TESTER SANGYO CO., LTD.) and heated and dried at 90° C. for 5 minutes, thereby obtaining a resin sheet having the PET film as a support and a resin layer with a thickness of 30 μm.

Using this resin sheet, a resin for evaluation was obtained in the same manner as in Example 1.

Comparative Example 4

A resin sheet was obtained in the same manner as in Comparative Example 3, except that 95 parts by mass of P-d-based benzoxazine (3,3'-(methylene-1,4-diphenylene)

bis(3,4-dihydro-2H-1,3-benzoxazine), manufactured by Shikoku Chemicals Corporation), which is a benzoxazine compound, was used as the resin or compound instead of 95 parts by mass of α-naphthol aralkyl-based cyanate resin (SNCN), and 2-ethyl-4-methylimidazole (2E4MZ), which is a curing accelerator, was not compounded. Using this resin sheet, a resin for evaluation was obtained in the same manner as in Example 1.

Comparative Example 5

A resin sheet was obtained in the same manner as in Comparative Example 3 except that 95 parts by mass of propylene glycol monomethyl ether acetate of TrisP-PA epoxy acrylate compound (KAYARAD (registered trademark) ZCR-6007H (product name), manufactured by Nippon Kayaku Co., Ltd.), which is the compound having an ethylenically unsaturated group, as the resin or compound instead of 95 parts by mass of α-naphthol aralkyl-based cyanate resin (SNCN) and 5 parts by mass of 2,2'-azobis(isobutyronitrile) (AIBN, manufactured by Fujifilm Wako Pure Chemical Corporation) as the curing accelerator instead of 5 parts by mass of 2-ethyl-4-methylimidazole (2E4MZ) were used. Using this resin sheet, a resin for evaluation was obtained in the same manner as in Example 1.

Comparative Example 6

A resin sheet was obtained in the same manner as in Comparative Example 3, except that 95 parts by mass of epoxy resin represented by the formula (23) (NC-3000 FH (product name), manufactured by Nippon Kayaku Co., Ltd.), which is the epoxy resin, was used as the resin or compound instead of 95 parts by mass of α-naphthol aralkyl-based cyanate resin (SNCN), and 2-ethyl-4-methylimidazole (2E4MZ), which is a curing accelerator, was not compounded. Using this resin sheet, a resin for evaluation was obtained in the same manner as in Example 1.

[Measurement and Evaluation of Physical Properties]

The resins for evaluation, which had been obtained in Examples and Comparative Examples, were measured and evaluated in accordance with the following methods. The results are shown in Tables 2 and 3.

<Photocurability Test>

By using a photo DSC (DSC-2500 (product name) manufactured by TA Instruments Japan Inc.) equipped with a light source (Omnicure (registered trademark) S2000 (product name) manufactured by U-VIX Corporation) that is capable of being irradiated with an active energy ray including a wavelength of 200 to 600 nm, the obtained resin for evaluation was irradiated with an active energy ray including a wavelength of 200 to 600 nm at an illuminance of 30 mW and for an exposure time of 3.5 minutes, thereby obtaining a graph of time (sec) on the horizontal axis and heat flow (mW) on the vertical axis.

A graph of time (sec) on the horizontal axis and heat flow (mW) on the vertical axis was obtained under the same conditions as described above except that a filter for a ray with a wavelength of 365 nm (i-line) or a filter for a ray with a wavelength of 405 nm (h-line) was used, and an active energy ray including a wavelength of 365 nm (i-line) or an active energy ray including a wavelength of 405 nm (h-line) was used.

In each graph, the enthalpy (J/g) was defined as the peak area when a line was drawn horizontally from the endpoint of the graph. The curability was evaluated in accordance with the following criteria.

AA: enthalpy was 20 (J/g) or more.

BB: enthalpy was 1 (J/g) or more and less than 20 (J/g).

CC: enthalpy was less than 1 (J/g).

Note that an enthalpy of 1 (J/g) or more means that the curing of the resin is sufficiently advanced by exposure at a predetermined wavelength.

<Heat Resistance (Glass Transition Temperature) Test>

The resin for evaluation cured in the photocurability test was further subjected to the postbaking step of heating at 180° C. for 120 minutes, and then the supports on both surfaces were peeled off to obtain a cured product for evaluation.

For this cured product for evaluation, the temperature was raised at 10° C./min using a DMA apparatus (a dynamic viscoelasticity measurement apparatus DMAQ800 (product name) manufactured by TA Instruments), and the peak position of the loss modulus was defined as the glass transition temperature (Tg, ° C.).

Note that, for the resins for evaluation obtained in Comparative Examples 1, and 3 to 6, "wrinkles" were generated in the postbaking step. These samples could not be measured because a smooth sample is required for heat resistance measurement. The resin for evaluation obtained in Comparative Example 2 was not photocured, but was thermally cured in the subsequent postbaking step, and the cured product obtained by this thermal curing was subjected to a heat resistance test.

<Elastic Modulus>

The resin for evaluation cured in the photocurability test described above was further subjected to the postbaking step of heating at 180° C. for 120 minutes, and then the supports on both surfaces were peeled off to obtain a cured product for evaluation.

For this cured product for evaluation, the temperature was raised at 10° C./min using a DMA apparatus (a dynamic viscoelasticity measurement apparatus DMAQ800 (product name) manufactured by TA Instruments), and the elastic modulus (MPa) was measured.

Note that, for the resins for evaluation obtained in Comparative Examples 1, and 3 to 6, "wrinkles" were generated in the postbaking step. These samples could not be measured because a smooth sample is required for elastic modulus measurement. The resin for evaluation obtained in Comparative Example 2 was not photocured, but was thermally cured in the subsequent postbaking step, and the elastic modulus of the cured product obtained by this thermal curing was measured.

<Thermal Stability Test>

The resin for evaluation cured in the photocurability test described above was further subjected to the postbaking step of heating at 180° C. for 120 minutes, and then the supports on both surfaces were peeled off to obtain a cured product for evaluation.

The mass of the cured product for evaluation was measured under a nitrogen atmosphere at a measurement start temperature (20° C.), a temperature increase rate (10° C./min), and a target temperature (500° C.) by a simultaneous differential thermal mass measuring device (TG-DTA 6200 (trade name) manufactured by Hitachi High-Tech Science Corporation). The temperature at which the mass reduction rate became 5% was evaluated as thermal stability (° C.).

TABLE 2

|  |  | Example 1 | Example 2 | Example 3 | Example 4 | Example 5 | Example 6 | Example 7 | Example 8 | Example 9 | Example 10 | Example 11 |
|---|---|---|---|---|---|---|---|---|---|---|---|---|
| Bismaleimide compound (A) | MIZ-001 | 47.5 | 47.5 | 47.5 | 94 | 47.5 | 47.5 | 47.5 | 94.9 | 94 | 85.5 | 19 |
| Resin or compound (B) | cyanate resin | 47.5 | | | | | 47.5 | 47.5 | 0.1 | 1 | 9.5 | 76 |
|  | benzoxazine compound | | 47.5 | | | | | | | | | |
|  | compound having ethylenically unsaturated group | | | 47.5 | | | | | | | | |
|  | epoxy resin | | | | 1 | | | | | | | |
|  | carbodiimide compound | | | | | 47.5 | | | | | | |
| Curing accelerator | 2-ethyl-4-methylimidazole | 5 | | | | | | | 5 | 5 | 5 | 5 |
|  | AIBN | | | | | 5 | | | | | | |
| Photo initiator (C) | Omnirad819 | 5 | 5 | 5 | 5 | 5 | | | 5 | 5 | 5 | 5 |
|  | Omnirad369 | | | | | | 5 | | | | | |
|  | Omnirad907 | | | | | | | 5 | | | | |
| Evaluation results | photocurability (365 nm) | AA | AA | AA | AA | AA | AA | AA | AA | AA | AA | AA |
|  | photocurability (405 nm) | AA | AA | AA | AA | AA | BB (18.8 J/g) | BB (1.5 J/g) | AA | AA | AA | AA |
|  | photocurability (200-600 nm) | AA | AA | AA | AA | AA | AA | AA | AA | AA | AA | AA |
|  | glass transition temperature (° C.) | 55 | 46 | 47 | 29 | 36 | 57 | 53 | 33 | 35 | 46 | 60 |
|  | elastic modulus | 1681 | 1668 | 1418 | 360 | 315 | 1588 | 1483 | 666 | 868 | 1365 | 1937 |
|  | 5% mass reduction temperature (° C.) | 269 | 316 | 352 | 265 | 202 | 290 | 249 | 252 | 252 | 281 | 250 |

TABLE 3

|  |  | Comparative Example 1 | Comparative Example 2 | Comparative Example 3 | Comparative Example 4 | Comparative Example 5 | Comparative Example 6 |
|---|---|---|---|---|---|---|---|
| Bismaleimide compound (A) | MIZ-001 | 95 | 50 | | | | |
| Resin or compound (B) | cyanate resin | | 50 | 95 | | | |
|  | benzoxazine compound | | | | 95 | | |
|  | compound having ethylenically unsaturated compound group | | | | | 95 | |
|  | epoxy resin | | | | | | 95 |
|  | carbodiimide compound | | | | | | |
| Curing accelerator | 2-ethyl-4-methylimidazole | | | | 5 | | |
|  | AIBN | | | | | 5 | |
| Photo initiator (C) | Omnirad819 | | 5 | 5 | 5 | | 5 |
|  | Omnirad369 | | | | | | |
|  | Omnirad907 | | | | | | |
| Evaluation results | photocurability (365 nm) | AA | CC | CC | CC | AA | CC |
|  | photocurability (405 nm) | AA | CC | CC | CC | AA | CC |
|  | photocurability (200-600 nm) | AA | CC | CC | CC | AA | CC |
|  | glass transition temperature (° C.) | not measurable | 52 | not measurable | not measurable | not measurable | not measurable |
|  | elastic modulus | not measurable | 1334 | not measurable | not measurable | not measurable | not measurable |
|  | 5% mass reduction temperature (° C.) | 233 | 343 | 238 | 204 | 383 | 243 |

Tables 2 and 3 reveal that the resin composition of the present embodiment is properly light-sensitive and can be photocured when exposed with any ray of light including a wavelength of 365 nm (i-line), an active energy ray including a wavelength of 405 nm (h-line) and an active energy ray including a wavelength of 200 to 600 nm. It is also found that as shown in Tables 2 and 3, the resin compositions of the present embodiment can provide cured products having excellent heat resistance, thermal stability, and insulation reliability in a well-balanced manner.

The present application is based on Japanese Patent Application No. 2019-122268 filed on Jun. 28, 2019, the contents of which are incorporated herein by reference.

INDUSTRIAL APPLICABILITY

The resin composition of the present embodiment has excellent photocurability and can provide a cured product having excellent heat resistance, thermal stability, and insulation reliability in a well-balanced manner, and therefore industrially useful, and can be used for applications including, for example, a photosensitive film, a photosensitive film with a support, a prepreg, a resin sheet, a circuit substrate (applications for a laminate, applications for a multilayer printed wiring board, and the like), a solder resist, an underfill material, a die bonding material, a semiconductor sealing material, a hole filling resin, and a component embedding resin.

The invention claimed is:

1. A multilayer printed wiring board comprising:
an insulating layer; and
a conductor layer formed on one surface or both surfaces of the insulating layer,
wherein the insulating layer comprises a resin composition comprising a bismaleimide compound (A) comprising a constituent unit represented by the following formula (1), and maleimide groups at both ends of the molecular chain;
at least one resin or compound (B) selected from the group consisting of a cyanate compound, a benzoxazine compound, an epoxy resin, a carbodiimide compound, and a compound having two or more ethylenically unsaturated groups in a molecule; and
a photo initiator (C):

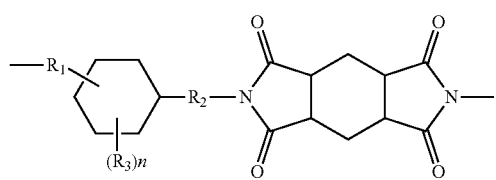

(1)

wherein $R_1$ represents a linear or branched alkylene group having 1 to 16 carbon atoms, or a linear or branched alkenylene group having 2 to 16 carbon atoms; $R_2$ represents a linear or branched alkylene group having 1 to 16 carbon atoms, or a linear or branched alkenylene group having 2 to 16 carbon atoms; each $R_3$ independently represents a hydrogen atom, a linear or branched alkyl group having 1 to 16 carbon atoms, or a linear or branched alkenyl group having 2 to 16 carbon atoms; and each n independently represents an integer of 1 to 10.

2. The multilayer printed wiring board of claim 1, wherein the photo initiator (C) comprises a compound represented by the following formula (2):

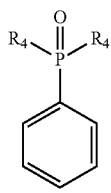

(2)

wherein each $R_4$ independently represents a substituent represented by the following formula (3) or a phenyl group; and

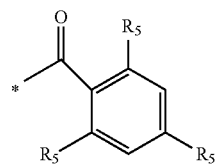

(3)

wherein -* represents a bonding hand, and each $R_5$ independently represents a hydrogen atom or a methyl group.

* * * * *